United States Patent
Dogruoz et al.

(10) Patent No.: US 11,647,607 B2
(45) Date of Patent: May 9, 2023

(54) LOCALIZED IMMERSION COOLING ENCLOSURE WITH THERMAL EFFICIENCY FEATURES

(71) Applicant: CISCO TECHNOLOGY, INC., San Jose, CA (US)

(72) Inventors: M. Baris Dogruoz, Campbell, CA (US); Mark Nowell, Kanata (CA); Yi Tang, San Jose, CA (US); Rakesh Chopra, Menlo Park, CA (US); Mandy Hin Lam, Fremont, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 160 days.

(21) Appl. No.: 17/156,085

(22) Filed: Jan. 22, 2021

(65) Prior Publication Data
US 2022/0239198 A1    Jul. 28, 2022

(51) Int. Cl.
H05K 7/20    (2006.01)
H05K 1/02    (2006.01)

(52) U.S. Cl.
CPC ....... *H05K 7/20236* (2013.01); *H05K 1/0203* (2013.01); *H05K 1/0272* (2013.01); *H05K 7/2089* (2013.01); *H05K 7/20627* (2013.01); *H05K 7/20636* (2013.01); *H05K 2201/064* (2013.01)

(58) Field of Classification Search
CPC ............ H05K 1/0203; H05K 7/20236; H05K 7/20636; H05K 7/20772
See application file for complete search history.

(56) References Cited

U.S. PATENT DOCUMENTS

| | | | |
|---|---|---|---|
| 6,427,449 B1 | 8/2002 | Logan et al. | |
| 6,717,812 B1 * | 4/2004 | Pinjala | H01L 25/0657 361/689 |
| 7,113,399 B2 | 9/2006 | Hisano et al. | |
| 7,857,636 B2 * | 12/2010 | Su | H05K 1/148 439/76.1 |
| 8,471,381 B2 * | 6/2013 | Owyang | G05F 3/08 257/676 |
| 8,619,425 B2 * | 12/2013 | Campbell | H05K 7/203 361/689 |
| 9,220,183 B1 * | 12/2015 | Buvid | H01L 25/0657 |
| 9,453,972 B1 | 9/2016 | Arvelo et al. | |
| 9,562,728 B2 | 2/2017 | Gotou et al. | |
| 9,854,697 B2 * | 12/2017 | Schmidtke | H04L 49/30 |
| 9,910,231 B2 | 3/2018 | Kelty et al. | |

(Continued)

FOREIGN PATENT DOCUMENTS

RU    2643173 C1    1/2018

OTHER PUBLICATIONS

International Search Report and Written Opinion in International Application No. PCT/US2021/019593, dated Jun. 9, 2021, 16 pages.

*Primary Examiner* — Zachary Pape

(57) ABSTRACT

In one embodiment, an apparatus includes an enclosure configured for connection to a printed circuit board, a substrate within the enclosure, a plurality of components mounted on the substrate, a fluid inlet connector, a fluid outlet connector, and a plurality of flow channels within the enclosure, at least one of the components disposed in each of the flow channels and segregated from other components in another of the flow channels. The enclosure is configured for immersion cooling of the components.

35 Claims, 19 Drawing Sheets

(56) References Cited

U.S. PATENT DOCUMENTS

| | | | |
|---|---|---|---|
| 10,104,760 B1 | 10/2018 | Briant et al. | |
| 10,178,804 B2 | 1/2019 | Sharf et al. | |
| 10,194,559 B2 * | 1/2019 | Saito | H01L 23/473 |
| 10,249,983 B2 | 4/2019 | Regnier et al. | |
| 10,321,609 B2 * | 6/2019 | Hirai | H05K 7/20236 |
| 10,438,867 B2 * | 10/2019 | Christiansen | H05K 7/20372 |
| 10,542,640 B1 * | 1/2020 | Leigh | H05K 7/20772 |
| 10,617,035 B2 | 4/2020 | Mayberry et al. | |
| 10,827,649 B2 | 11/2020 | Lunsman et al. | |
| 11,112,189 B2 | 9/2021 | Nakano et al. | |
| 2011/0134604 A1 | 6/2011 | Attlesey | |
| 2011/0315344 A1 | 12/2011 | Campbell | |
| 2013/0068433 A1 | 3/2013 | Muthigi et al. | |
| 2013/0105120 A1 | 5/2013 | Campbell | |
| 2014/0146468 A1 | 5/2014 | Campbell | |
| 2014/0321053 A1 * | 10/2014 | Donnelly | H05K 7/20209 |
| | | | 361/691 |
| 2014/0339693 A1 | 11/2014 | Hotta | |
| 2014/0340848 A1 | 11/2014 | Vos | |
| 2015/0062806 A1 | 3/2015 | Shelnutt | |
| 2015/0077937 A1 | 3/2015 | Daly et al. | |
| 2016/0192534 A1 | 6/2016 | Pons et al. | |
| 2017/0208705 A1 | 7/2017 | Swenson | |
| 2017/0269314 A1 | 9/2017 | Gaal | |
| 2019/0222211 A1 * | 7/2019 | Yang | H03K 17/785 |
| 2019/0226765 A1 | 7/2019 | Xu et al. | |
| 2019/0246523 A1 | 8/2019 | Boyden et al. | |
| 2019/0288353 A1 | 9/2019 | Harris et al. | |
| 2020/0006884 A1 | 1/2020 | Weltsch et al. | |
| 2020/0093031 A1 | 3/2020 | Chopra | |
| 2020/0229321 A1 | 7/2020 | Dogruoz et al. | |
| 2021/0282301 A1 | 9/2021 | Dogruoz et al. | |

\* cited by examiner

LOCALIZED IMMERSION COOLING ENCLOSURE WITH THERMAL EFFICIENCY FEATURES

TECHNICAL FIELD

The present disclosure relates generally to cooling of electronic or optical components, and more particularly, to immersion cooling.

BACKGROUND

Over the past several years, there has been a tremendous increase in the need for higher performance communications networks. Increased performance requirements have led to an increase in energy use resulting in greater heat dissipation from components. Cooling of high-power or high-density electronic or optical components is increasingly becoming a critical limitation in many network systems. As power use and density increases, traditional air-cooling may no longer be adequate to cool network devices and liquid cooling may be needed. There are a number of drawbacks with conventional liquid cooling techniques.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
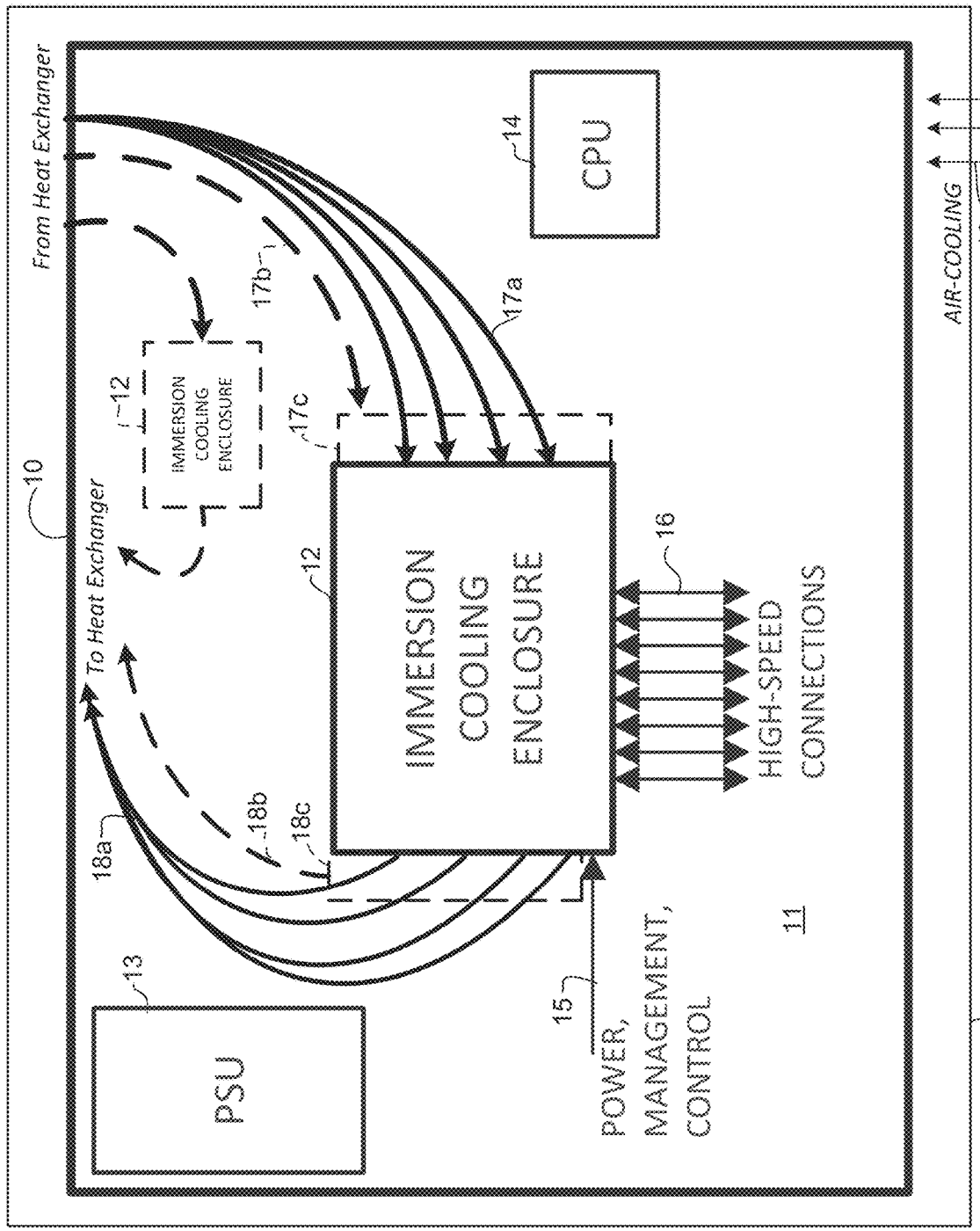
FIG. 1 schematically illustrates a line card with a localized immersion cooling enclosure, in accordance with one embodiment.

In one embodiment, an apparatus generally comprises an enclosure configured for connection to a printed circuit board, a substrate within the enclosure, a plurality of components mounted on the substrate, a fluid inlet connector, a fluid outlet connector, and a plurality of flow channels within the enclosure, at least one of the components disposed in each of the flow channels and segregated from other components in another of the flow channels. The enclosure is configured for immersion cooling of the components.

In another embodiment, an apparatus generally comprises a printed circuit board and an enclosure coupled to the printed circuit board and comprising a substrate within the enclosure, a plurality of components mounted on the substrate, a heat sink thermally coupled to at least one of the components and contained within the enclosure, a fluid inlet connector, and a fluid outlet connector. The enclosure is configured for immersion cooling of the components.

In another embodiment, a printed circuit board generally comprises an immersion cooling enclosure connected to the printed circuit board and comprising a plurality of electronic components within the immersion cooling enclosure, a heat generating component located external to the immersion cooling enclosure, and a heat transfer element for transferring heat from the heat generating component into the immersion cooling enclosure. A dielectric liquid passes through the immersion cooling enclosure for dissipation of heat from the electronic components and the heat generating component.

In yet another embodiment, an apparatus generally comprises an enclosure configured for connection to a daughter card, a substrate within the enclosure, a plurality of components mounted on the substrate, a fluid inlet connector, and a fluid outlet connector. The enclosure is configured for immersion cooling of the components.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Next generation packages for network equipment will likely include electronic, optical, or electrical and optical components responsible for various tasks under a single package on the same substrate. For example, packages may include heterogeneous integration of die, high bandwidth memory, SerDes (SerializerDeserializer), optical engine, or any combination of these or other components defining a System-in-Package (SiP). All of these components will have one or more localized hot spots and each may have a different temperature limit (e.g., die<105-110° C., high bandwidth memory<95° C., optical engine with local laser<70-75° C.).

Conventional cooling techniques have varying efficiencies and design or operation complexities. These techniques range from traditional air-cooling designs, to a more complex cold-plate approach utilizing indirect liquid cooling to remove heat from a cooling element, and to the highly efficient but operationally challenging immersion cooling wherein an entire piece of equipment (e.g., chassis) is submerged into an electrically non-conductive liquid. Air-cooling typically reaches its limits when a single packaged component (e.g., an NPU (Network Processing Unit) with high-speed SerDes) exceeds 400 W/in$^2$. In some cases, dense circuit boards may include multiple NPUs, resulting in even greater heat generation. Indirect liquid cooling may provide a viable solution in some implementations as it provides several orders of magnitude higher cooling capacity and improved efficiency (reduced pumping power) as compared to air-cooling. Immersion cooling is even more efficient than indirect liquid cooling (e.g., via cold plate) since the liquid is brought directly to the heat source. However, conventional large scale immersion cooling where an entire chassis is immersed in a liquid bath requires substantial changes to both the equipment and facility infrastructure.

The embodiments described herein provide a localized immersion cooling enclosure with thermal efficiency features that take advantage of highly efficient immersion cooling to solve challenging thermal issues while addressing design and operational challenges of conventional systems. The localized immersion cooling described herein does not need any infrastructure changes at the chassis level and provides high performance and efficiency as needed. The localized design allows for immersion cooling of only selected components and provides a significant amount of flexibility for implementation on various modular line card designs. Immersion cooling techniques may be leveraged to address localized critical thermal hot-spot components. For example, the localized immersion cooling enclosure may include all of the high-power components on a line card or a subset of components while allowing air-cooling to be used for remaining components. The immersion cooling enclosure may include any combination of electrical or optical components and connectors for providing electrical power, electrical data (low-speed data (e.g., management, control), high-speed data), or optical data to the components along with fluid connectors for providing a flow of fluid through the enclosure. The fluid carries heat from the components out of the immersion cooling enclosure to provide localized immersion cooling to the heat generating components. Localized immersion cooling of electronic or optical components provides improved energy efficiency and higher performance cooling as compared to indirect liquid cooling or full immersion cooling of a chassis. A low-pressure immersion cooling system is operable to manage large amounts of heat load with ultra-low pumping power as compared to an air-cooling system. In one or more embodiments, the immersion cooling enclosure provides a low profile (height) design that fits in a 1 RU (Rack Unit) slot of a chassis or other constrained environment. In one or more embodiments, the immersion cooling enclosure may include multiple fluid inlets and fluid outlets with channel separation to avoid mixing of cooling flow between different components, thereby providing efficient and optimized cooling for specific applications through adjustment of flow distribution. In one or more embodiments, heat sinks may be included within the enclosure and perforated separators may be disposed within the channels to direct liquid flow to a top portion of heat sink fins (e.g., to maintain most of the liquid flow on the fin side, as described below). In one or more embodiments, an external air-cooled heat sink may augment the cooling provided by the immersion cooling enclosure and provide fail-safe operation in case of a failure in the liquid cooling system.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. One or more of the network devices may comprise one or more line cards comprising one or more immersion cooling enclosures described herein. The network device may include one or more processor, memory, and network interfaces, with one or more of these components located on the line card, which is removably inserted into a chassis of the network device. The network device may include any number of slots for receiving any number or type of line cards, including, for example, fabric cards, service cards, combo cards, controller cards, processor cards, network cards, high density line cards, high power line cards, or high density and power line cards, arranged in any format (e.g., positioned horizontally or vertically).

In one or more embodiments, each immersion cooling enclosure may contain a plurality of high-power components immersed in a liquid supplied via a fluid circuit that enables removal of heat. Since the liquid is in direct contact with active electronic components, the liquid comprises a dielectric coolant. In one or more embodiments, the cooling system comprises a low-pressure, low-speed immersion based coolant system utilizing electrically non-conductive (dielectric) liquid. The dielectric liquid may comprise any suitable dielectric coolant, including for example, R1234ze (Z), HFE-7100, FC-72, or any other suitable dielectric fluid. The fluid may flow through one or more closed loop cooling circuits.

The coolant may be provided by a source of low-temperature supply coolant that is sent through distribution plumbing coupled to liquid cooling lines, and routed through immersion cooling enclosures inside the network device, as described below. Warmed coolant may be aggregated through a return manifold where it passes through a heat exchanger to remove the heat from the coolant loop to an external cooling plant, with the cycle then repeating. The heat exchanger may be a liquid-liquid heat exchanger or a liquid-air heat exchanger, with fans provided to expel the waste heat to the atmosphere, for example. The heat exchanger may be located within the network device, adjacent to the network device, or remote from the network device at a central location that services any number of network devices. For example, the heat exchanger may be located within the same rack as the network device or the system may be connected to a building wide liquid cooling distribution system.

The size of the fluid distribution lines may be determined based on the number of components to be cooled and the thermal capacity of the components. For example, different capacity coolant distribution lines may be used based on the number of components to be cooled using immersion cooling. Flow network modeling may be performed to take into account coolant system components and number of components within each immersion cooling enclosure. The heat exchanger may be sized to adequately remove heat produced by the components via the coolant distribution system.

Pumps for coolant distribution may be located external to the network device or within the modular electronic system. Additional pumps may also be located as needed within the coolant loop. In one or more embodiments, various sensors may monitor aggregate and individual branch coolant temperatures, pressures, flow rate quantities, or any combination thereof, at strategic points around the loop to identify loss of coolant or cooling, or the need for additional cooling. As noted above, the coolant system may comprise a low-pressure circuit and the pumps may be designed for low (or ultra-low) pumping power (e.g., lower power than used for air-cooling).

Referring now to the drawings, and first to FIG. 1, a line card (module) 10 with an immersion cooling enclosure (ICE) 12 is shown, in accordance with one embodiment. In the simplified schematic shown in FIG. 1, the line card 10 includes a power supply unit (PSU) 13 and a central processing unit (CPU) 14 mounted directly on a printed circuit board (PCB) 11. The term "printed circuit board" as used herein may refer to any suitable substrate (laminate, polymer, ceramic) or electronics board for mounting of components (e.g., electrical components, optical components) on the line card. The term "line card" as used herein may refer to any card configured for insertion into the network device (e.g., fabric card, controller card, network card, daughter card or mezzanine card coupled to line card, and the like).

The line card 10 may include any number or type of components in any arrangement. For example, the line card may include pluggable optics (not shown in FIG. 1), which may be cooled by forced air (e.g., air-cooling from fan). In one or more embodiments, the line card may comprise a mix of the pluggable optics and co-packaged optics enabling support for coherent optics or copper cables. The immersion cooling enclosure 12 allows co-packaged optics based NPU and optics (or other components) to be efficiently cooled and provides a subset of the optical interfaces, but the remaining bandwidth capacity may be brought out of the immersion cooling enclosure via high-speed copper (e.g., PCB traces or twinax cables) to pluggable module connectors to provide flexibility to insert any optics, including high-power coherent modules. The immersion cooling enclosure 12 allows air-cooling capacity needed from the fans to be reduced, thereby lowering power requirements since there is a reduced thermal load that the fans need to cool.

Figure 2:
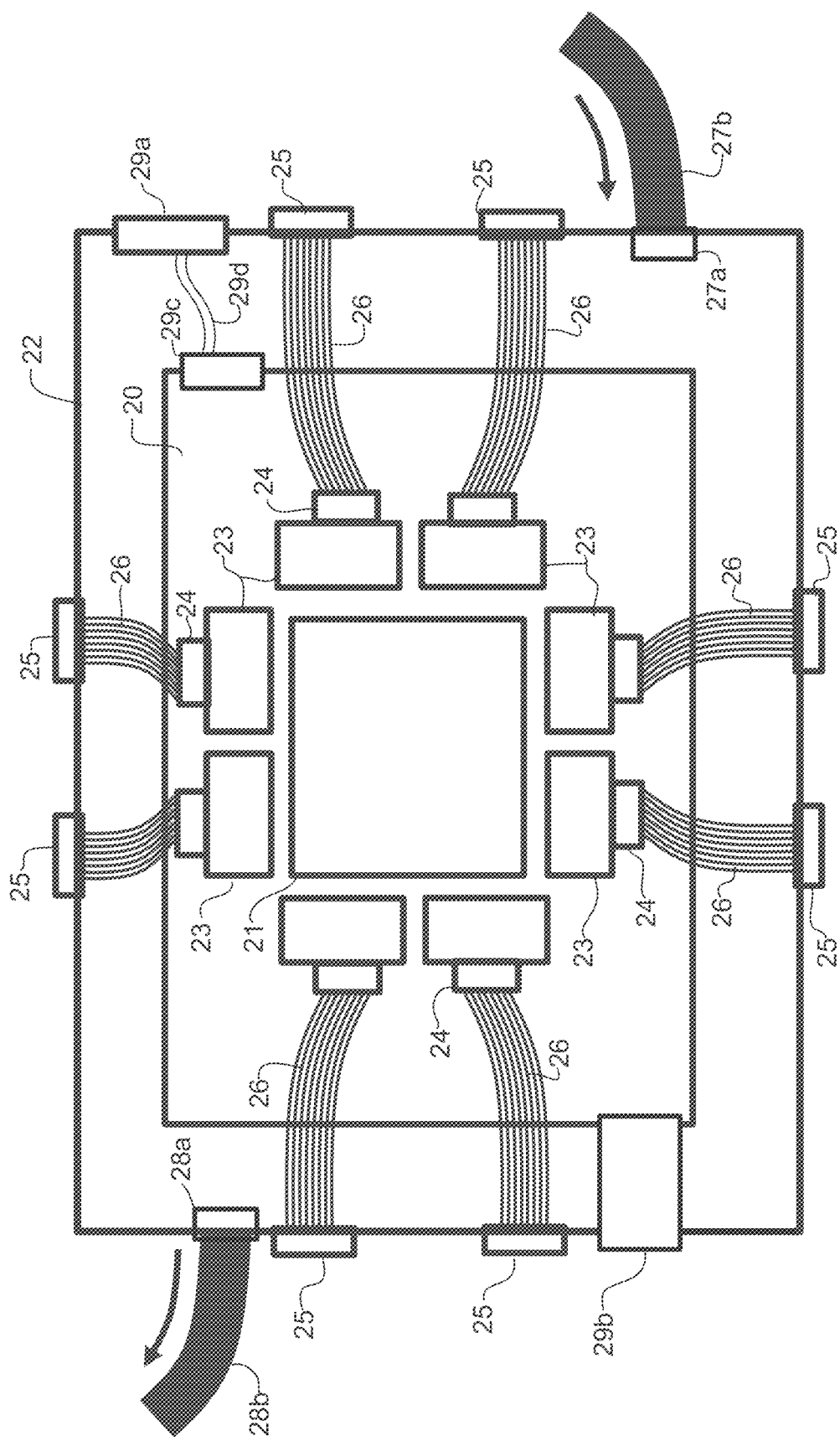
FIG. 2 illustrates an example of components within the immersion cooling enclosure.

In one or more embodiments, the line card 10 is configured for insertion into a network device 9 (e.g., slot of a chassis configured for receiving one or more line cards) and comprises a printed circuit board 11, at least one electronic component (e.g., CPU 14) mounted on the PCB and configured for direct air-cooling (e.g., from fan providing air flow over the line card) as indicated at 19, and the enclosure 12 comprising a plurality of electronic components, an electrical connector, a fluid inlet connector, and a fluid outlet connector (described below with respect to FIG. 2). The fan (not shown) may be positioned on the line card 10 or another location within the network device for providing air-flow over the components not contained within the immersion cooling enclosure 12. Components mounted directly on the printed circuit board 11 may be, for example, lower power components that do not need the extra cooling provided by the immersion cooling enclosure 12. A dielectric liquid is disposed within the enclosure 12 for immersion cooling of the electronic components during operation of the network device.

The localized immersion cooling enclosure 12 contains one or more heat generating components (electrical component, optical component) immersed in the dielectric liquid supplied via a liquid circuit that enables removal of heat. The immersion cooling enclosure 12 is positioned (connected, mounted, disposed) on the line card 10 and comprises a plurality of interfaces (e.g., electrical, optical, fluid). In the example shown in FIG. 1, the immersion cooling enclosure 12 comprises an electrical interface for receiving power or data (e.g., management data, control data), or both power and data on line 15. As shown in the example of FIG. 1, the immersion cooling enclosure 12 may also include a high-speed data interface for receiving or transmitting high-speed data on bi-directional lines 16. The high-speed interconnects may be optical, or electrical via PCB traces or high-speed cables (e.g., twinax (twinaxial) cables). The immersion cooling enclosure may also include one or more midplane connections (not shown) for connecting lines with midplane connectors, or integrated midplane connectors. The electrical (power, data) line 15 may be coupled to a component on the line card (e.g., PSU 13, CPU 14) or receive power or data from another source in the network device (e.g., cable connected to line card). The high-speed connections 16 may receive data from other components on the line card (e.g., pluggable optical modules) or cables connected to the line card, for example.

In one example, a cool dielectric fluid is supplied to the enclosure at the fluid inlet lines 17a and a warm dielectric fluid exits the enclosure at the fluid outlet lines 18a in a low-pressure circuit. The dielectric liquid immerses and surrounds all of the internal components (electrical, optical, electrical and optical) to provide a highly efficient thermal path as heat energy is absorbed into the liquid. In another example, the cool fluid is also supplied at line 17b and warm fluid may also exit at line 18b. As described below, all components within the immersion cooling enclosure 12 may be immersed in the same liquid or the immersion cooling enclosure may comprise multiple flow channels with components segregated between flow channels to isolate heat dissipation between different components. Multiple fluid inlet lines 17a and fluid outlet lines 18a may be used to transport liquid coolant through the channels or an inlet manifold 17c and outlet manifold 18c may be used to separate flow received at the single fluid inlet line 17b and aggregate flow into the single fluid outlet line 18b. Thus, the immersion cooling enclosure 12 may be configured for connection to a single fluid inlet line 17b and fluid outlet line 18b with inlet and outlet manifolds 17c, 18c separating (or aggregating) the fluid into four (or any other number of channels), as shown in phantom in FIG. 1. As described below, the enclosure 12 may define one channel, in which case only one fluid inlet line and one fluid outlet line are needed, or two or more channels with a corresponding number of inlet ports and outlet ports.

In one or more embodiments, the enclosure 12 may be mounted on the line card 10 with at least one other immersion cooling enclosure cooling another component or group of components. A second immersion cooling enclosure 12 is shown in phantom in FIG. 1, but for simplification, power, data, or optical connections are not shown. As described below, one or more of the immersion cooling enclosures 12 may be mounted on a daughter card or other card coupled to the printed circuit board 11 (e.g., motherboard). The line card 10 may include any number of immersion cooling enclosures 12 comprising any number or type of connections and any number, type, or combination of heat generating components (e.g., high-power components, electrical components, optical components) may be located within the immersion cooling enclosure. The immersion cooling enclosures 12 may be arranged in parallel, with cool liquid lines entering each immersion cooling enclosure independently and warm liquid cooling lines transferring liquid out of each of the enclosures as shown in FIG. 1, or arranged in a series cooling liquid circuit in which cool liquid flows into the first immersion cooling enclosure, warm liquid flows out of the first immersion cooling enclosure and into the second immersion cooling enclosure, and warmer liquid flows out of the second immersion cooling enclosure. The fluid lines 17a, 17b, 18a, 18b may be coupled to a fluid circuit (e.g., low-pressure dielectric cooling circuit) coupled to a heat exchanger. As described above, components of the liquid cooling circuit (e.g., temperature monitors, pumps, heat exchangers) may be located on the line card or external to the line card (e.g., another line card or external to network device).

Each immersion cooling enclosure 12 on the line card 10 comprises at least one dedicated thermal path transporting heat from a group of components segregated from another group of components on a line card, which may be air-cooled or contained in a separate immersion cooling enclosure, to a dielectric fluid in motion.

The immersion cooling enclosure 12 may contain (surround, enclose) any number of electronic components (e.g., ASIC (Application Specific Integrated Circuit) or other integrated circuit, chip, die, processor, memory, or high heat density electronic component), optical components (e.g., optical chip, optical engine, laser, light source), or other heat generating component in which heat dissipation capability of the component is insufficient to moderate its temperature. In one or more embodiments, the immersion cooling enclosure 12 comprises a heterogeneous structure comprising one or more die, memory device (e.g., on-substrate memory, high-bandwidth memory), SerDes, or on board optics/optical engine with or without a lid, located within the enclosure comprising the dielectric liquid.

As shown in FIG. 2, in one embodiment, the heterogenous components are integrated in a single package on the same substrate (system-in-package (SIP)), which is contained within the immersion cooling enclosure. FIG. 2 illustrates an example of an immersion cooling enclosure 22 with electronic and optical components (e.g., ASIC and co-packaged optics). A top of the immersion cooling enclosure 22 is removed in FIG. 2 to show details internal to the enclosure. In one or more embodiments, an apparatus comprises the enclosure 22 for mounting on a line card (e.g., line card 10 in FIG. 1), a substrate 20 within the enclosure, an electronic component 21 mounted on the substrate, an optical component 23 mounted on the substrate (e.g., either directly or indirectly), an electrical connector 29a, 29b for transmitting power or data (e.g., power and low-speed electrical data (control, management), high-speed electrical data) to the electronic component 21 within the enclosure, an optical connector 25 (e.g., dense optical connector) for transmission of optical data to or from the optical component 23 within the enclosure, a fluid inlet connector 27a, and a fluid outlet connector 28a. The dielectric liquid is disposed within the enclosure 22 for immersion cooling of the electronic component 21 and the optical component 23 with the enclosure mounted on the line card. Cool fluid enters the enclosure 22 at ingress line 27b, passes over the internal components, and warm fluid exits at egress line 28b.

In the example shown in FIG. 2, the immersion cooling enclosure 22 contains an electronic integrated circuit (ASIC, NPU (Network Processing Unit)) 21 and photonic integrated circuits 23 (photonic chip, silicon photonics, optics technology) mounted on the substrate 20. The term "substrate" as used herein may refer to an electrical board, ceramic board, or an element formed from any other suitable material. In this example, the NPU 21 is surrounded by eight silicon photonic chips 23. As described below, the immersion cooling enclosure 22 may contain any number, type, or arrangement of electronic components, optical components, or both electronic and optical components. An FAU (Fiber Array Unit) 24 connects the photonic chip 23 to the optical connector 25 through any number of optical fibers 26. The optical connector 25 may comprise, for example, a plurality of optical fibers passing through a wall of the enclosure 22. In one example, the NPU 21 may receive power from power connector 29a and management and control data from data connector 29b. The connectors 29a, 29b may be coupled to the NPU 21 through the substrate 20. In one example, connector 29a is coupled to mating connector 29c on the substrate through cables 29d. In another example, connector 29b is connected to the substrate. Connectors may also be attached to a bottom or top of the enclosure, as noted below.

It is to be understood that the line card 10 shown in FIG. 1 and components within the immersion cooling enclosure 22 shown in FIG. 2 are only examples and the immersion cooling enclosure described herein may be used in other arrangements (e.g., in combination with one or more other immersion cooling enclosures) or with any number or type of heat generating components contained within the enclosure and any number or type of external connections. As previously noted, the localized immersion cooling enclosure enables all or only a portion of the thermal challenges to be addressed using immersion cooling technology. Based on product needs, different components may be included within the immersion cooling enclosure or cooled by other means (e.g., air-cooled by fans). The immersion cooling enclosure technology described herein may be implemented in other layouts comprising any number of enclosures coupled to any number or type of connections with series or parallel liquid cooling circuits, and on any type or arrangement of line card without departing from the scope of the embodiments. For example, the immersion cooling enclosure may include any number of liquid ingress ports or egress ports. One or more of the immersion cooling enclosures may be a socketed enclosure with mating liquid connectors included in the attached structure.

As previously noted, the components within the immersion cooling enclosure may be referred to as a system-in-package (SiP). In one or more embodiments, an NPU and embedded/co-packaged optics may be contained within the enclosure with a fixed optical interface configuration at the time of manufacturing. In one or more embodiments, the NPU may be integrated into the immersion cooling enclosure with no optics within the enclosure and air-cooled pluggable optical modules on the line card. In this example, the high-power NPU may be cooled within the immersion cooling enclosure without the need to liquid cool optical components, thereby providing user flexibility of optics. In one or more embodiments, an NPU and embedded/co-packaged optics may be integrated into the immersion cooling enclosure and air-cooled pluggable optical modules may be located on the line card. This example provides flexibility as to the portion of optical ports that may be pluggable and enables a solution for a line card mix of pluggable modules and embedded interfaces. In one or more embodiments, the immersion cooling enclosure described herein may comprise components or connections as described in U.S. patent application Ser. No. 17/145,816, filed Jan. 11, 2021, entitled "Immersion Cooling Enclosure", which is incorporated herein by reference in its entirety.

Figure 3:
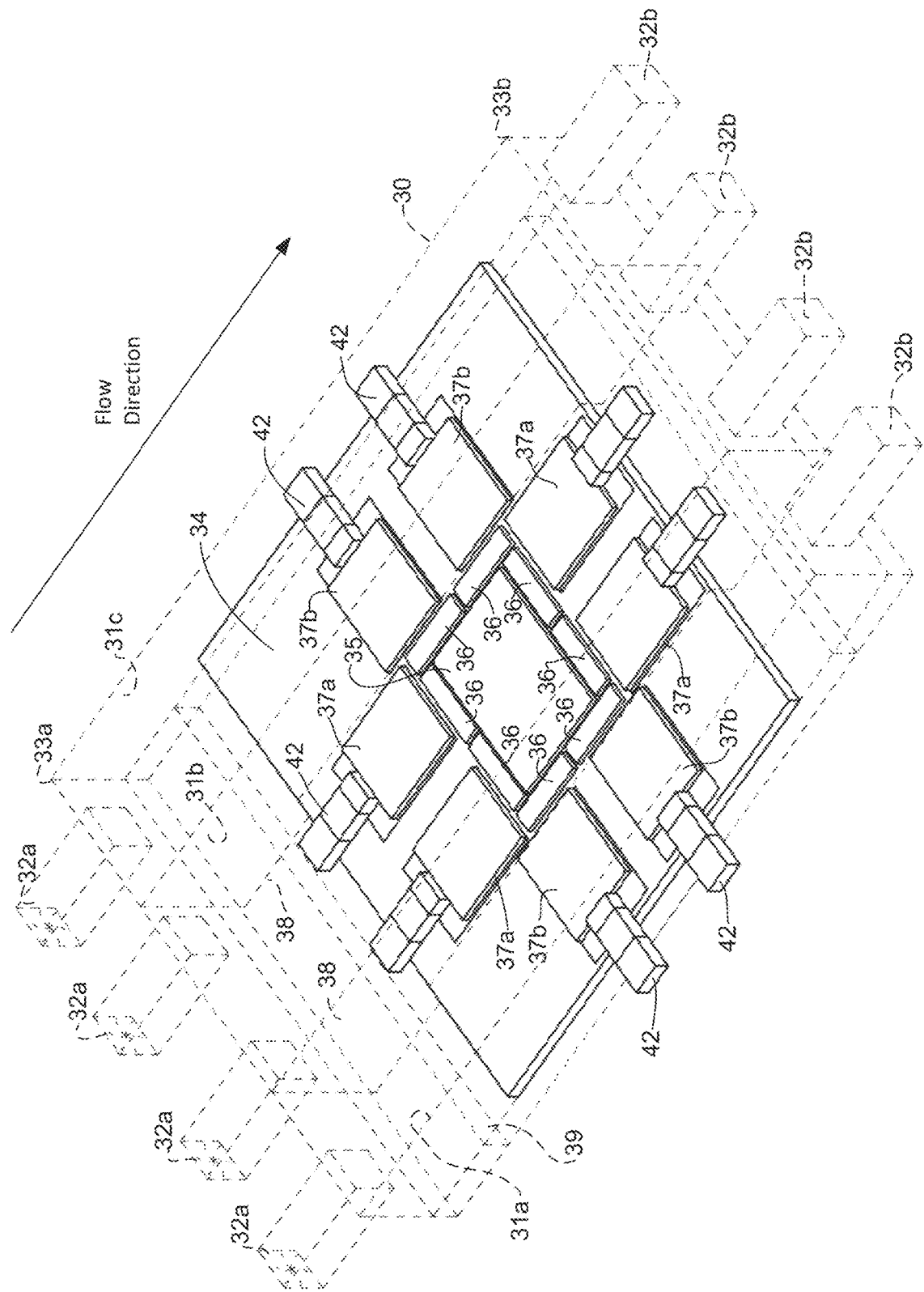
FIG. 3 is a perspective of the immersion cooling enclosure with internal components shown, in accordance with one embodiment.
Figure 7:
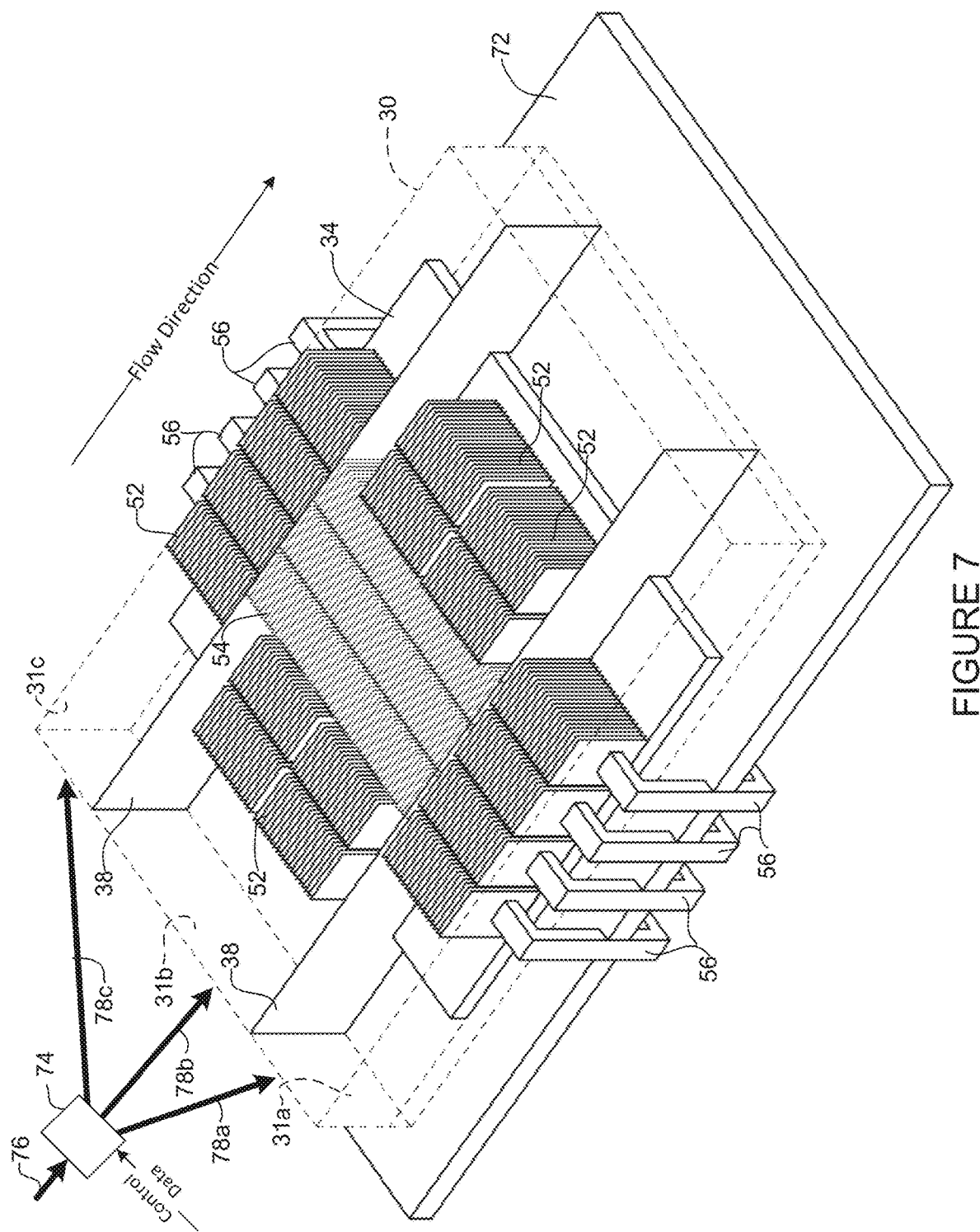
FIG. 7 is a perspective of the immersion cooling enclosure of FIG. 5 mounted on a printed circuit board and a control valve at a fluid inlet for controlling flow in flow channels within the enclosure, in accordance with one embodiment.

FIG. 3 is a perspective of an immersion cooling enclosure 30, in accordance with one embodiment. The enclosure 30 is shown in phantom to illustrate details of components within the enclosure. In one or more embodiments, an apparatus comprises the enclosure 30 configured for connection to a printed circuit board (as shown in FIGS. 1 and 7), a substrate 34 within the enclosure, a plurality of components (e.g., electronic components 35, 36, optical components 37a, 37b) mounted on the substrate, at least one fluid inlet connector 32a, at least one fluid outlet connector 32b, and a plurality of flow channels 31a, 31b, 31c (e.g., two or more) within the enclosure. At least one of the components 35, 36, 37a, 37b is disposed in each of the flow channels 31a, 31b, 31c and segregated from the other components in a different flow channel (e.g., by channel separators 38). As described above, the enclosure 30 is configured for immersion cooling of the components.

The channel separators 38 avoid mixing of flow between the three channels 31a, 31b, 31c. In the example shown in FIG. 3, four fluid inlet connectors 32a are provided at an inlet manifold 33a and four fluid outlet connectors 32b are provided at an outlet manifold 33b. The flow rate may be controlled to meet instantaneous cooling needs. For example, the flow rates for the sides may be lowered while the flow rate in the middle channel is increased. In one or more embodiments, an in-channel separator (e.g., perforated separator) 39 may be positioned to direct flow towards an upper portion of the channel containing heat sinks, as described below.

The substrate 34 is disposed within the immersion cooling enclosure 30 with a plurality of components mounted thereon. In one example, the substrate may be mounted on a printed circuit board (not shown) contained within the enclosure. In one or more embodiments, the enclosure 30 contains at least two different types of electronic components (e.g., NPU and SerDes). In the example shown in FIGS. 3 and 4, an NPU 35 is mounted in the center of the substrate 34, surrounded by eight SerDes chips 36. Eight optical engines 37a, 37b are mounted around the NPU and SerDes. The optical engines 37a, 37b each include an optical connection (e.g., FAU) 42. Any number of optical fibers may be connected to each FAU 42. As noted above, electrical power or data may be provided via PCB traces or cables, for example.

As shown in the example of FIG. 3, the outer flow channels 31a, 31c provide cooling flow only to side optical engines 37b and the inner channel 31b provides cooling flow to both electronic components (NPU 35, SerDes 36) and optical components (middle optical engines 37a). Depending on the instantaneous power generation from the components, flow distribution between the channels may be adjusted via an inlet valve at the inlet manifold 33a, as described below with respect to FIG. 7.

It is to be understood that the number, type, and arrangement of components, and number, size, or arrangement of channels may be different than shown herein without departing from the scope of the embodiments. For example, one or more flow channels may extend parallel to a sidewall of the enclosure or at any other angle or combination of directions to provide independent cooling of components in any arrangement on the substrate 34. Also, a single channel enclosure or multiple channel (e.g., 2, 3, 4, or more) enclosure may be used based on power dissipation of components and arrangement within the enclosure. Each channel may be in fluid communication with one or more fluid inlet connector 32a and fluid outlet connector 32b.

Figure 4:
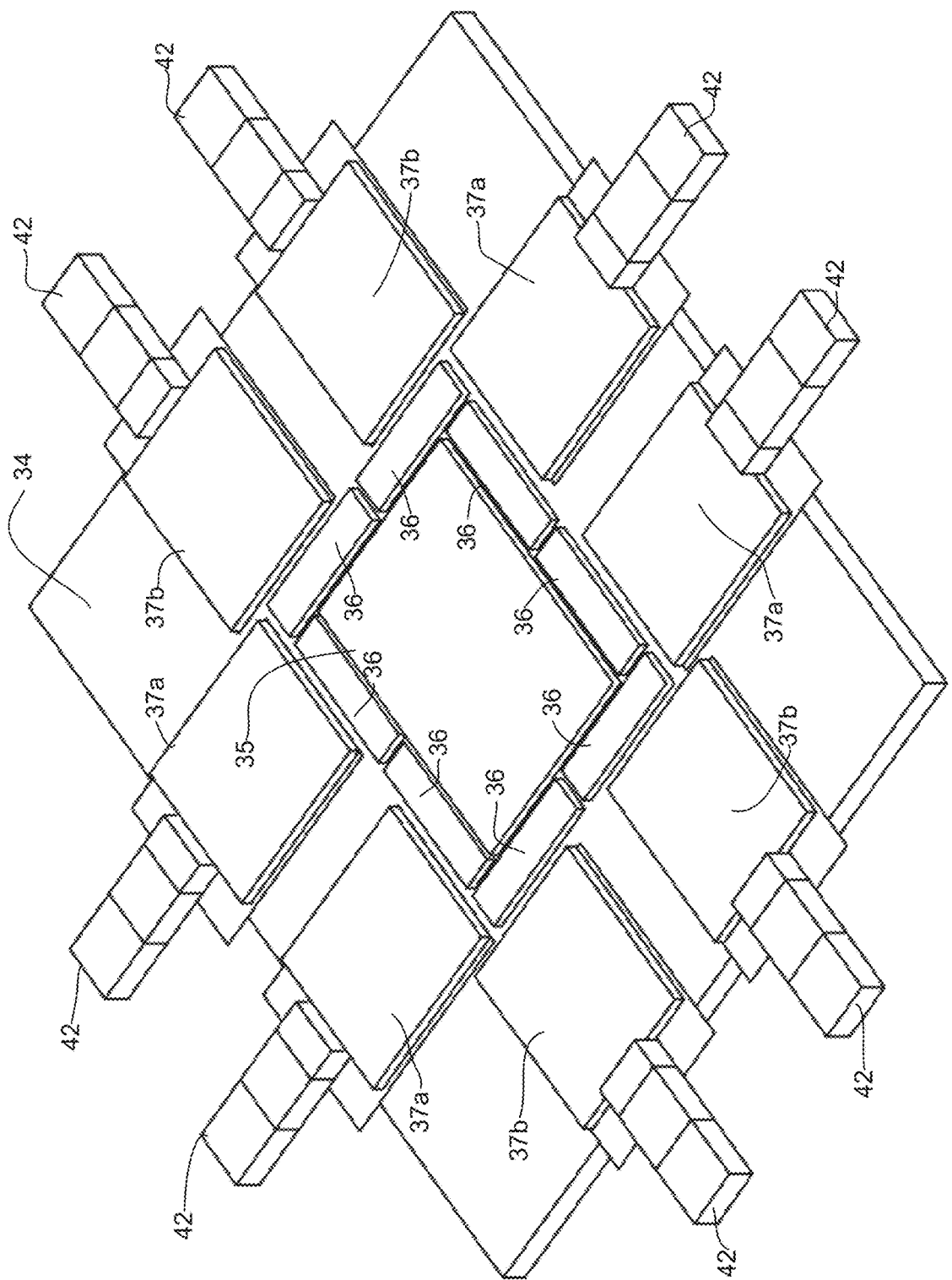
FIG. 4 is a perspective of the internal components shown in FIG. 3.
Figure 5:
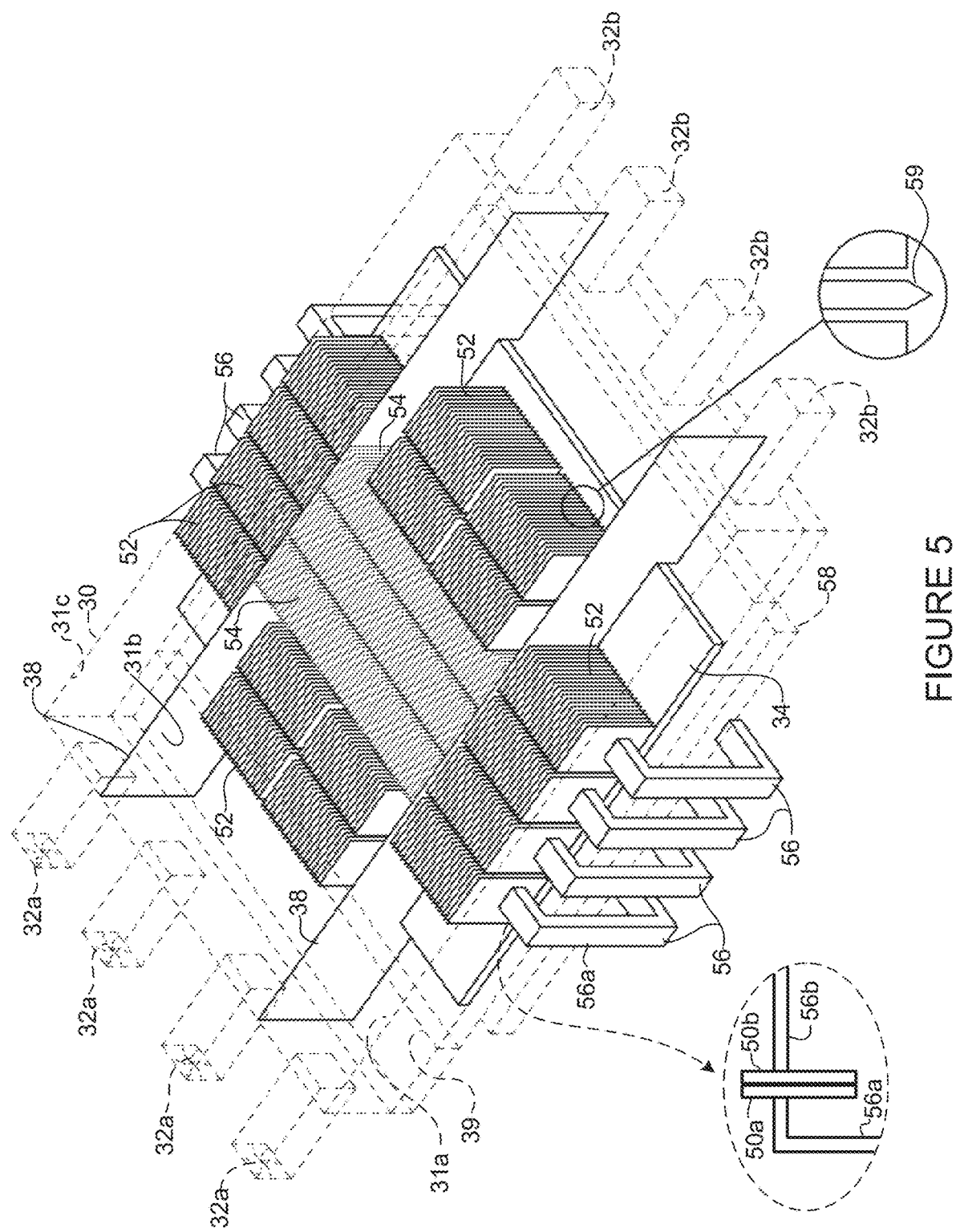
FIG. 5 is a perspective illustrating heat sinks installed in the immersion cooling enclosure of FIG. 3 and external heat pipes coupled to the immersion cooling enclosure, in accordance with one embodiment.

FIG. 5 is a perspective of the enclosure 30 shown in FIG. 3, with a plurality of heat sinks 52, 54 disposed on the electrical and optical components shown in FIGS. 3 and 4. The heat sinks 52, 54 are positioned within the enclosure 30 and thermally coupled to the electronic and optical components for use in immersion cooling. Liquid flows through channels defined by fins to carry heat away from the components. In this example, two four heat sinks 52 are positioned over each of the optical engines and three rows of heat sinks 54 are positioned over the NPU and SerDes within the middle channel 31b. A row of four heat sinks 52 are positioned over the side optical engines within the side channels 31a, 31c. In one or more embodiments, the heat sink base may be configured with V-grooves 59 (as shown in the enlarged cut-out in FIG. 5) or any other shape to increase the surface area exposed to the liquid for improved heat dissipation. The heat sinks 52, 54 may comprise any number, type, or shape fins, which may be formed, for example, from copper, aluminum, or another suitable material. The high surface area of the fins allows heat to be dissipated from the fins into the liquid surrounding the fins and carried out in the liquid cooling circuit.

Figure 6:
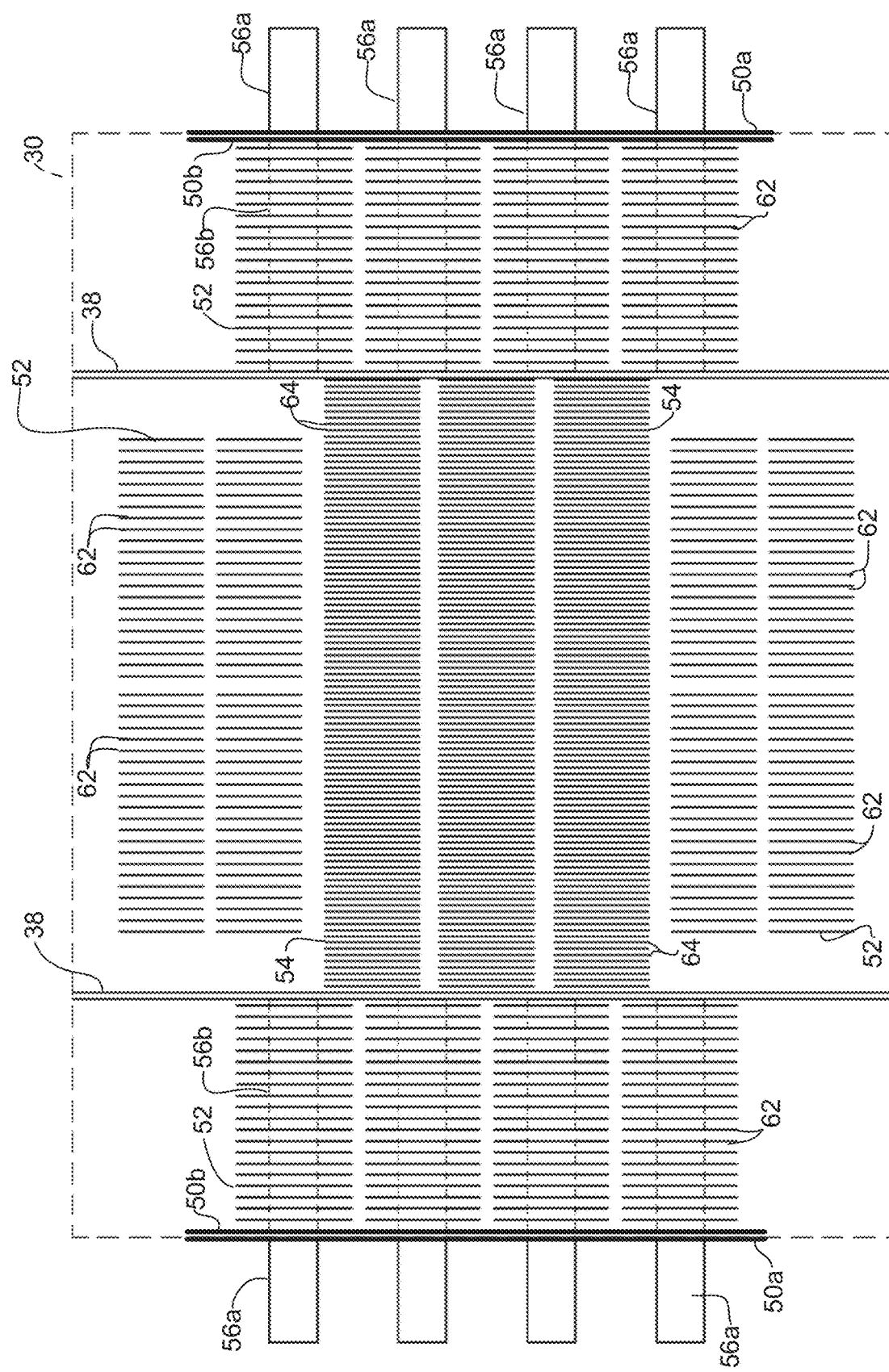
FIG. 6 is a top view of the immersion cooling enclosure of FIG. 5.
Figure 8:
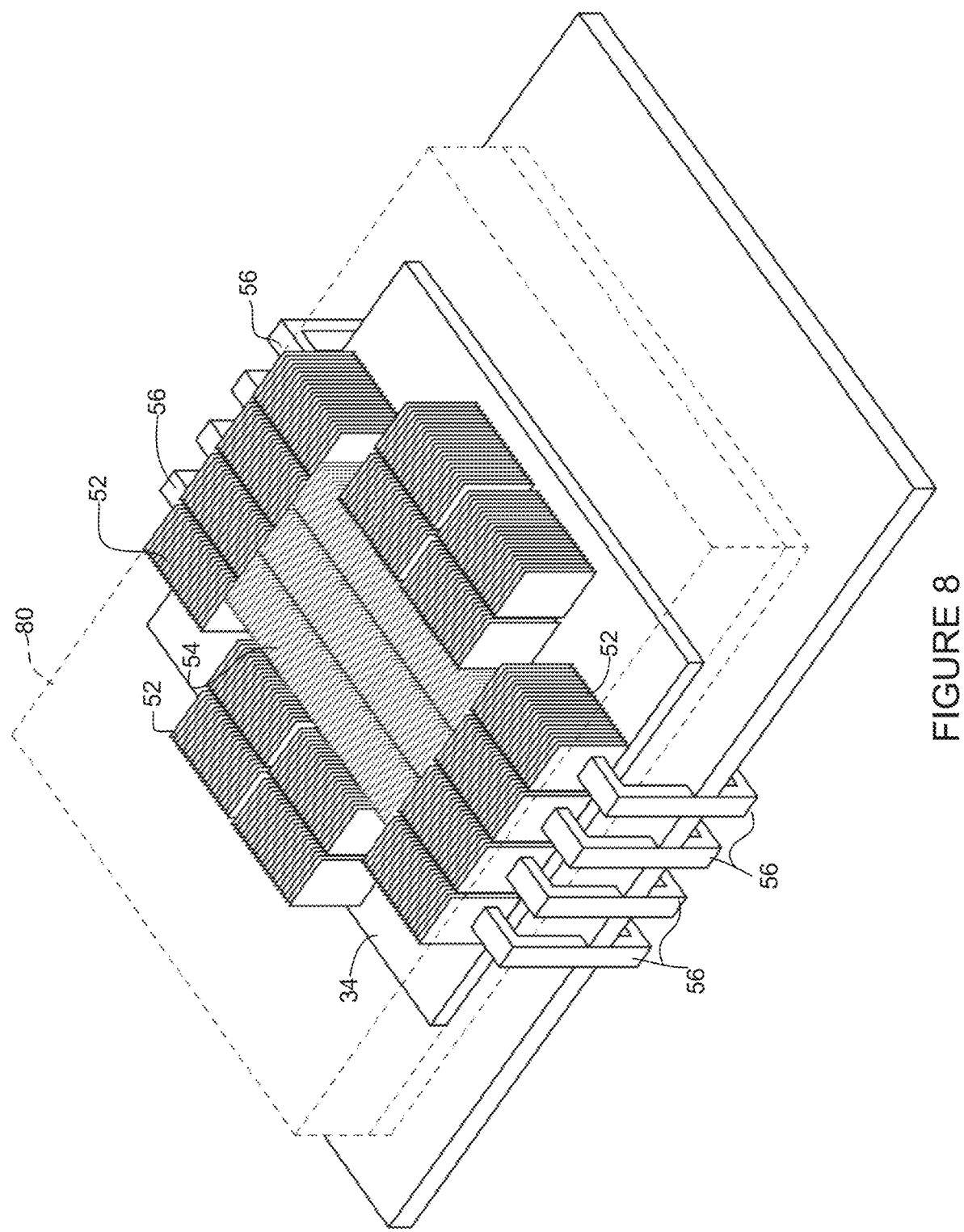
FIG. 8 is a perspective of the immersion cooling enclosure with a single flow channel defined by the enclosure.

In one or more embodiments, a heat transfer element (e.g., heat pipe) 56 may be used to transfer heat from a component disposed external to the enclosure 30 to within the enclosure. As shown in the example of FIG. 5, a plurality of heat pipes 56 may be coupled to a heat spreader, which may be attached to the external wall (or walls) of the immersion cooling enclosure 30 to transport heat produced by a component positioned external to the enclosure. For example, as shown in the cutout view in FIG. 5, an external heat pipe 56a may be connected to an outer heat spreader/wall 50a and thermally coupled to a similar heat pipe spreader assembly comprising an internal heat pipe 56b connected to an inner spreader/wall 50b positioned on an inner wall (or walls) of the immersion cooling enclosure 30. The internal heat pipes 56b may be attached to the heat sink fins 52 (as shown in FIG. 6). It should be noted that the internal heat pipes 56b are optional, with structures 50a, 50b operating as heat spreaders and transmitting heat to the immersion fluid. The outer and inner heat spreaders 50a, 50b may be mechanically attached or glued and there may be sealant or a gasket between the structures. For simplification, only an external heat pipe structure is shown in FIGS. 7 and 8. It is to be understood that the heat pipe 56 shown in the Figures may comprise a detachable assembly as shown in the cutout view of FIG. 5 and described above.

As described below with respect to FIGS. 9 and 10, the heat pipes 56 may be used to transfer heat generated by any high-power components (e.g., POL (Point-of-Load) modules) to within the enclosure 30. The enclosure 30 is thus operable to absorb heat generated by surrounding components and transported via conduction or passive devices into the fluid. It is to be understood that the heat pipes 56 shown in FIG. 5 are only an example and any number size, shape, or arrangement of heat pipes or other heat transfer elements may be used.

As described above with respect to FIG. 3, channel separators 38 define the multiple flow channels 31*a*, 31*b*, 31*c*, each with a dedicated thermal path transporting heat from a group of components segregated from other components to the dielectric fluid in motion. As previously noted, the middle channel 31*b* provides heat dissipation to the centrally located components (e.g., NPU 35, SerDes 36, and optical components 37*a* in FIG. 4) and the side channels 31*a*, 31*c* provide heat dissipation to the side components (optical engines 37*b* in FIG. 4) and external components (an example shown in FIG. 10). In-channel flow diverters 39 (in-channel separators) may be positioned within the channels to direct flow to the top of the fins of the heat sinks 52, 54. The in-channel flow diverters 39 may be perforated (e.g., grill or other structure comprising a plurality of openings).

FIG. 6 is a top view of the heat sinks 52, 54 within the enclosure 30 of FIG. 5. As shown in this example, a fin density may be different for the heat sinks 52 thermally coupled to the optical components and the heat sinks 54 thermally coupled to the electronic components. In this example, fins 62 of the heat sinks 52 (optical component heat sinks) are less dense than the fins 64 on the central heat sinks 54 (electronic component heat sinks). In one example, fin density may be increased to enhance heat transfer on the exhaust side optical engines of the central channel at a slightly higher pressure drop (i.e., inlet side optical engine heat sinks are not at the same density as the exhaust side optical engine heat sinks for the middle channel). The fin cutouts may also be designed to produce higher heat transfer coefficients at the heat sink entry regions.

As previously described with respect to FIG. 5, the heat pipes may comprise a detachable external structure and an internal structure. As shown in FIG. 6, external heat pipes 56*a* are connected to heat spreader 50*a* (attached or integral with external wall of the enclosure 30) and internal heat pipes 56*b* are connected to heat spreader 50*b* (attached or integral with internal wall of the enclosure). The internal heat pipes 56*b* may connect to or extend through the fins 52, as shown in FIG. 6. As previously noted, the internal heat pipes 56*b* are optional.

FIG. 7 shows the immersion cooling enclosure 30 located on a PCB 72. In one embodiment, an apparatus comprises the printed circuit board 72 and the enclosure 30 coupled to the printed circuit board and comprising the substrate 34 within the enclosure, a plurality of components (e.g., electrical, optical) mounted on the substrate, at least one heat sink thermally coupled to at least one of the components and contained within the enclosure, a fluid inlet connector (e.g., one or more fluid inlet connectors 32*a* in FIG. 3), and a fluid outlet connector (e.g., one or more fluid outlet connectors 32*b* in FIG. 3). The enclosure 30 is configured for immersion cooling the components and comprises three flow channels 31*a*, 31*b*, 31*c* defined by channel separators 38. Heat sinks 52 and 54 are shown mounted on components disposed on the substrate 34 and external heat pipes 56 may also be coupled to the immersion cooling enclosure so that the side heat sinks may also dissipate heat from these external sources, as previously described.

In one or more embodiments, a control valve 74 may control flow to each of the three flow channels 31*a*, 31*b*, 31*c* at fluid inlet lines 78*a*, 78*b*, 78*c*, respectively. The control valve 74 may be located at the enclosure (e.g., inlet manifold) or located upstream of the enclosure. Flow may be individually controlled to each of the flow channels 31*a*, 31*b*, 31*c* based on thermal loads within each of the flow channels. The thermal load may be defined, for example, based on a temperature within the enclosure or at components within the enclosure or a power load at one or more components within the enclosure. For example, the control valve 74 may vary flow between the flow channels based on control or monitoring data received from a central controller, the line card, the immersion cooling enclosure 30, or another immersion cooling enclosure mounted on the line card. Various sensors may monitor aggregate and individual branch coolant temperatures, pressures, and flow rate quantities at strategic points around the coolant loop. For example, temperature sensors may monitor die temperatures of critical semiconductors, temperatures of critical components (e.g., optical devices) or the liquid temperature inside the sealed immersion cooling enclosure. Other sensors may monitor current, voltage, power, or any combination thereof at the enclosure 30 or components within the enclosure to identify current operating conditions and adjust cooling flow as needed. One or more valves 74 may be used to control the amount of cooling delivered to each of the flow channels 31*a*, 31*b*, 31*c* based upon their instantaneous needs.

In another example, a central controller may control flow to plurality of immersion cooling enclosures 30 based on instantaneous needs at each of the enclosures. A central control system may monitor internal temperatures at one or more flow channels or immersion cooling enclosures and adjust the coolant flow to maintain a set point temperature. A feedback system may be used to ensure the correct coolant flow is always present. As described above with respect to FIG. 3, one or more of the flow channels may receive fluid from more than one flow inlet line.

FIG. 8 is a perspective of an immersion cooing enclosure 80 comprising a single flow channel defined by the internal walls of the enclosure, in which the same liquid flow cools all of the components within the enclosure. The enclosure 80 may include one or more liquid flow inlet and one or more liquid flow outlet (not shown).

Figure 9:
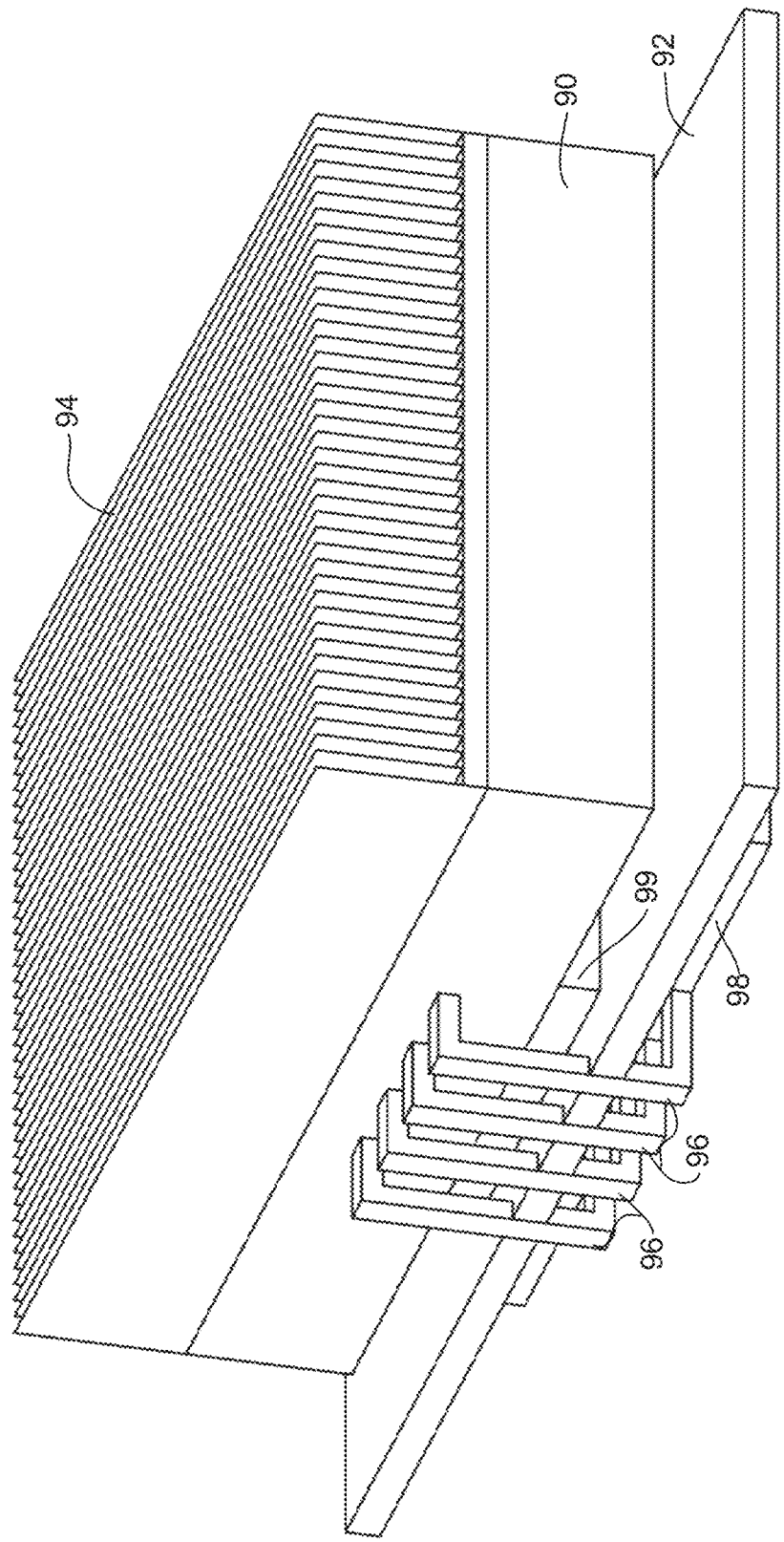
FIG. 9 is a top perspective of the immersion cooling enclosure with an external heat sink, in accordance with one embodiment.
Figure 10:
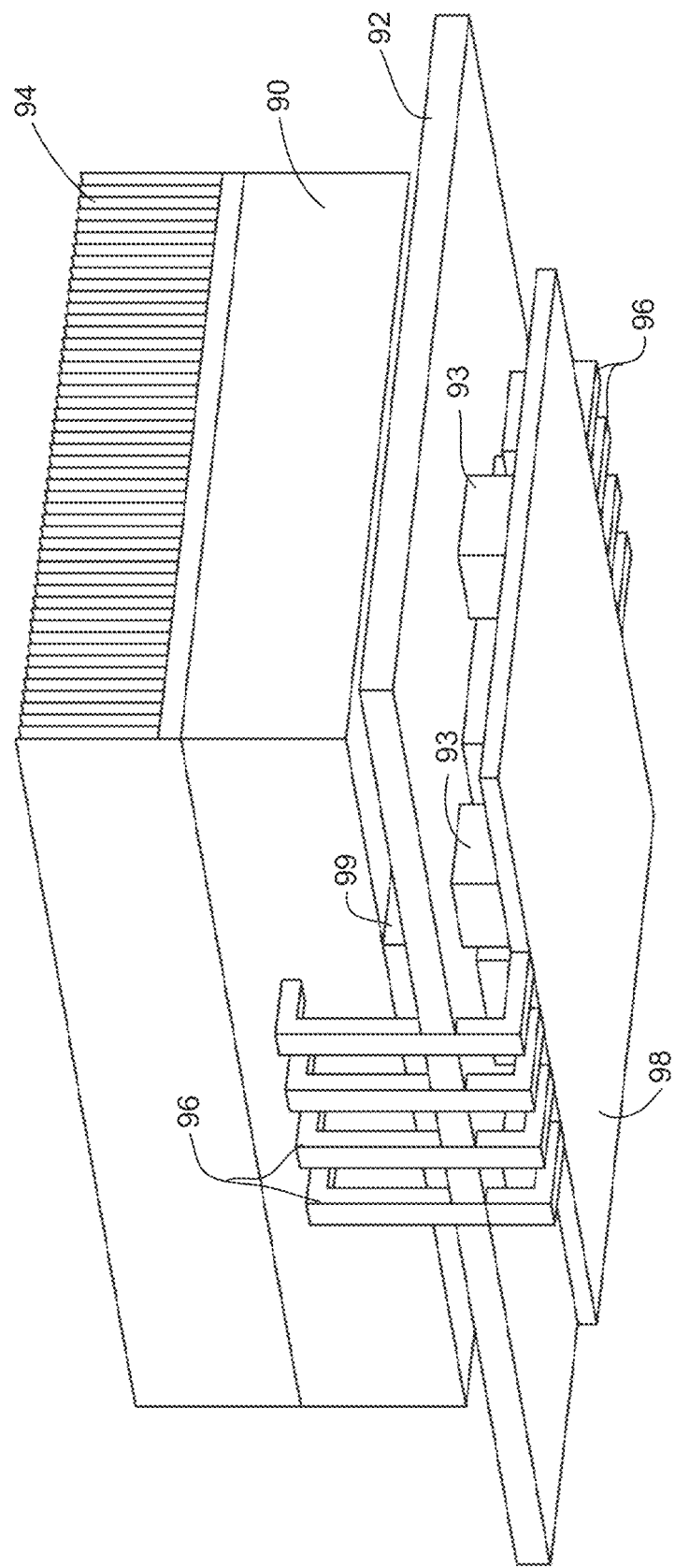
FIG. 10 is a bottom perspective of the immersion cooling enclosure and heat sink of FIG. 9 with POL (Point-of-Load) modules positioned below the printed circuit board.

FIGS. 9 and 10 illustrate an immersion cooling enclosure 90 mounted on a PCB 92 with an external heat sink 94 mounted on an outer surface (top) of the enclosure. The flow inlet and outlet connections are not shown in FIGS. 9 and 10. In this example, the immersion cooling enclosure 90 is coupled to the PCB 92 through a connector 99.

In one embodiment, an apparatus comprises the immersion cooling enclosure 90 connected to the printed circuit board 92 and comprising a plurality of electronic components, a heat generating component (e.g., POL modules 93 in FIG. 10) located external to the immersion cooling enclosure, and a heat transfer element (e.g., heat pipes 96 or other conductive element) for transferring heat from the heat generating component to the immersion cooling enclosure for dissipation within the enclosure. The dielectric liquid passes through the immersion cooling enclosure 90 for dissipation of heat from the electronic components and the heat generating component.

As shown in FIG. 10, heat pipes 96 transfer heat from POL modules (POL power supplies, POL devices, POLs) 93 disposed on a substrate 98 positioned below the PCB 92 to the enclosure 90. Heat from the POLs 93 is transferred to the substrate 98 and transferred to the immersion cooling enclosure 90 via the heat pipes 96. Even though the POL modules 93 are disposed external to the enclosure 90, the heat produced by the POL modules is transferred into the enclosure. It is to be understood that the POL modules 93 and location of the POL modules relative to the enclosure 90 is only an example and any type, number, size, or arrangement of heat generating components may be disposed below the PCB 92, on top of the PCB, or on another PCB. The external heat pipes 96 may be detachable, as previously described, extend through openings in the PCB 92, and connect to a heat spreader coupled to substrate 98.

A lid of the enclosure 90 may function as a base for the external heat sink 94 and a top cover for the internal heat sinks. The enclosure 90 shown in FIGS. 9 and 10 provides a hybrid cooling arrangement combining immersion and air cooling. If there is a failure of the immersion cooling system (e.g., cooling leak, pump failure), air-cooling fans may be turned on or fan speed increased to ensure fail-safe operation for at least a limited capacity utilizing the cooling capabilities of the external heat sink 94. The combination of internal immersion cooling heat sinks with the external air-cooling heat sink 94 provides longer resilience in the case of a failure. The heat sink 94 may be configured to sustain limited capacity operation in a fail-safe mode, for example.

Figure 11A:
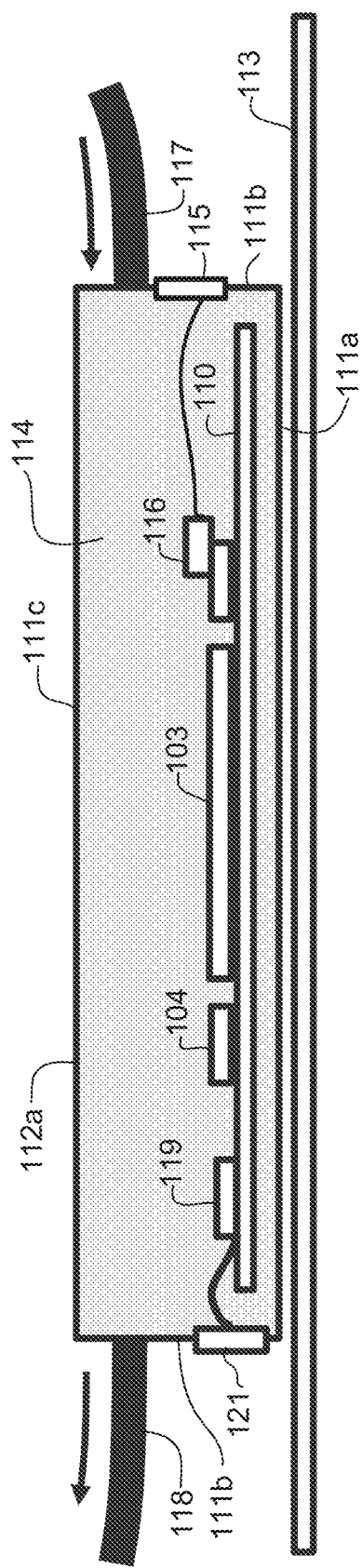
FIG. 11A is a side view of an immersion cooling enclosure with sidewall connections.
Figure 11B:
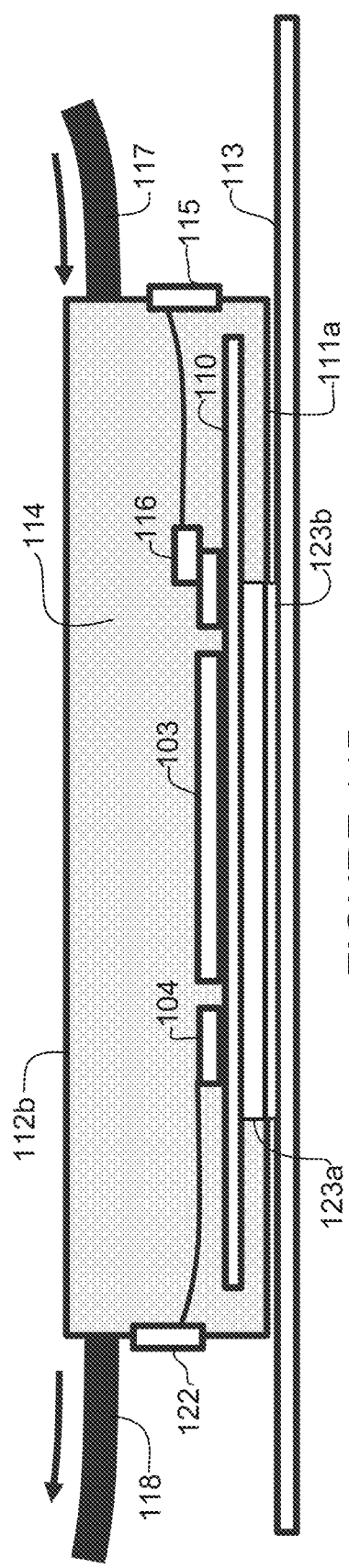
FIG. 11B is a side view of the immersion cooling enclosure with sidewall and PCB (Printed Circuit Board) connections.

FIGS. 11A and 11B are side views of immersion cooling enclosures 112a and 112b, respectively. For simplification, only some of the connections are shown. The sealed enclosure 112a, 112b is defined by a housing comprising a first wall 111a for mounting on a PCB 113 of a line card and a plurality of external walls (sidewalls 111b, upper wall 111c) forming the housing with the first wall (FIG. 11A). One or more connectors 115, 121 may be located on one or more of the sidewalls 111b, the first wall (bottom face 111a), or both the bottom wall and sidewalls. It should be noted that the terms lower, upper, bottom, top, below, above, horizontal, vertical, and the like, which may be used herein are relative terms dependent upon the orientation of the line card or enclosure and should not be interpreted in a limiting manner. These terms describe points of reference and do not limit the embodiments to any particular orientation or configuration.

The sealed enclosure 112a, 112b is filled (or at least partially filled) with dielectric liquid 114. In this example, the immersion cooling enclosure 112a of FIG. 11A contains an NPU 103, SerDes 104, silicon photonics chip 116, and power convertor 119. The dielectric liquid is of sufficient volume to submerge components 103, 104, 116, 119, which dissipate varying amounts of heat to the liquid. The liquid is received at ingress line 117 and exits at egress line 118. In the example shown in FIG. 11A, the silicon photonics chip 116 is coupled to dense optical connector 115 and the power converter 119 is coupled to the power connector 121. High voltage power may be provided with internal down conversion, for example. The SerDes 104 is coupled to a dense high speed electrical connector 122 in FIG. 11B. High-speed input/output may be in the form of optical connectors or high-speed copper cables (e.g., twinax) as described above.

In the example shown in FIG. 11B, external connections are made through a dense PCB connector 123a on a surface (lower or bottom surface 111a as viewed in FIG. 11B) of the immersion cooling enclosure 112b. The dense PCB connector 123a (electrical connector) may be directly coupled to the PCB 113 at mating PCB connector 123b and comprises surface PCB connections for one or more of power, high-speed electrical, or low-speed electrical (e.g., control and management). The connector 123a is sealingly engaged with the enclosure (housing) 112b. Electrical connectivity of power or management signal may be brought in through the sidewall connector 121 or through the PCB connector 123a. Connections between connectors 121, 123a and electronic components 103, 104 may be routed through traces in the substrate 110.

The PCB connector 123a may be manufactured into the enclosure 112b so that the sealed enclosure is easily mounted on the mating connector 123b on the PCB 113 as the enclosure is pressed down onto the line card during assembly. This allows for the immersion cooling enclosure to be manufactured independently from the line card and easily mounted on the line card. For example, the components 103, 104, 116, 119 shown in FIGS. 11A and 11B and associated connections to the sidewall connectors 115, 121, 122 and bottom surface PCB connector 123a may be formed within the housing so that the sealed enclosure can be provided as a module ready to mate with the electrical, data, optical, and fluid connections and mounted on the PCB, thus reducing manufacturing complexity since the immersion cooling enclosure is separately assembled. The line card manufacturing and assembly is thereby separated from the potentially more complex co-packaged optics manufacturing and assembly, thus allowing different manufacturing specialization to be used as needed.

It is to be understood that the connections shown in FIGS. 11A-11B are only examples and the immersion cooling enclosure may include one or more sidewall connectors, one or more PCB connectors, or both sidewall and PCB connectors. The immersion cooling enclosure may include, for example, one or more low-speed data connectors (e.g., control or management input/output), high-speed data connectors, power connectors, and fluid connectors. In another example, the enclosure may include an integrated midplane connector on a sidewall or a BGA (Ball Grid Array) connection on a bottom surface to the PCB 113.

Also, as previously noted, any number or type of components or any number of substrates may be included in the immersion cooling enclosure. For example, the immersion cooling enclosure may include one or more electronic components including for example, CMOS (Complementary Metal-Oxide-Semiconductor) die, NPUs, SerDes chiplets, CDR (Clock-and-Data Recovery) circuit, retimer chip, FPGA (Field-Programmable Gate Array), microprocessor, or any other chip, die, or circuit. The immersion cooling enclosure may also include one or more optical components, including for example, co-packaged or embedded optical engines, lasers, or light sources, or power components, including for example, power converter, power distribution device, or POL (Point-of-Load) device, or any other component or device. The immersion cooling enclosure may include, for example, multiple ASIC or NPU in one enclosure or any combination of ASIC/NPU, SerDes, optical engines, or other components. A die of the component may or may not be in contact with the dielectric fluid. For example, in one or more embodiments, a die package (lid) is in contact with the fluid and in one or more embodiments the die is in direct contact with the fluid.

Figure 12A:
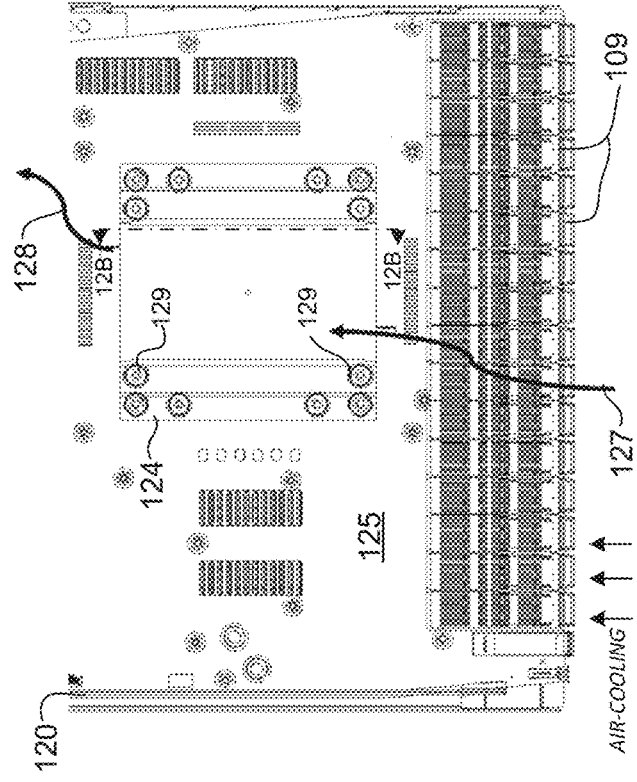
FIG. 12A is a top view of the immersion cooling enclosure mounted on a line card with pluggable optical modules.
Figure 12B:
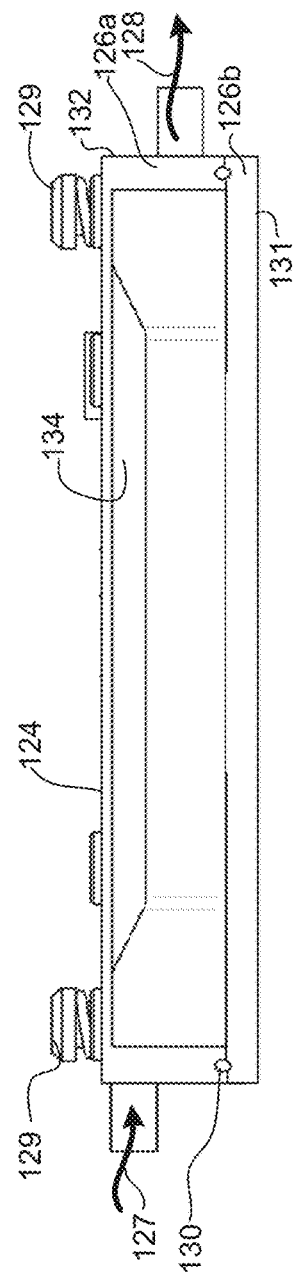
FIG. 12B is a cross-sectional view taken along line 12B-12B in FIG. 12A.

FIG. 12A is a top view of a module (line card, network card) 120 comprising a plurality of pluggable optical modules 109 inserted into optical module cages mounted on the line card and an immersion cooling enclosure 124. The enclosure 124 may be mounted on the line card 120 with any number of spring loaded screws 129 (or other suitable fasteners). FIG. 12B is a cross-sectional view taken along line 12B—12B in FIG. 12A. A housing defines the sealed enclosure and comprises a first wall 131 for mounting on a PCB 125 of the line card and a plurality of external walls 132 (sidewalls, top wall) forming the housing with the first wall. The housing defines a fully sealed enclosure using submerged seals receiving fluid in a low pressure system. As previously described, an electrical connector or optical connector may be positioned on one of the external walls 132.

As shown in FIG. 12B, the immersion cooling enclosure 124 comprises an upper housing 126a and a lower housing 126b with a water-tight silicone seal 130 or other sealing mechanism provided at the interface of the lower and upper housings to define a fluid-tight compartment for the dielectric fluid. The housing is configured to surround and form a sealed enclosure about the electronic, optical, or electronic and optical components contained within internal chamber 134. For simplification, internal components and external connections other than fluid connections to fluid lines 127, 128, are not shown in FIG. 12B.

The fluidic coupling between the ingress and egress liquid cooling lines 127, 128 and the enclosure (housing) 124 may be established using suitable hoses, tubes, and connectors (e.g., quick disconnects). For example, quick disconnect couplings may be used to couple flexible tubes to the coolant inlet and outlet of the sealed housing to allow for ease of installation or removal of the immersion cooling enclosure from the line card. Sealed electrical and optical connectors may provide electrical, optical, or network connections to the components disposed within the immersion cooling enclosure.

Figure 13:
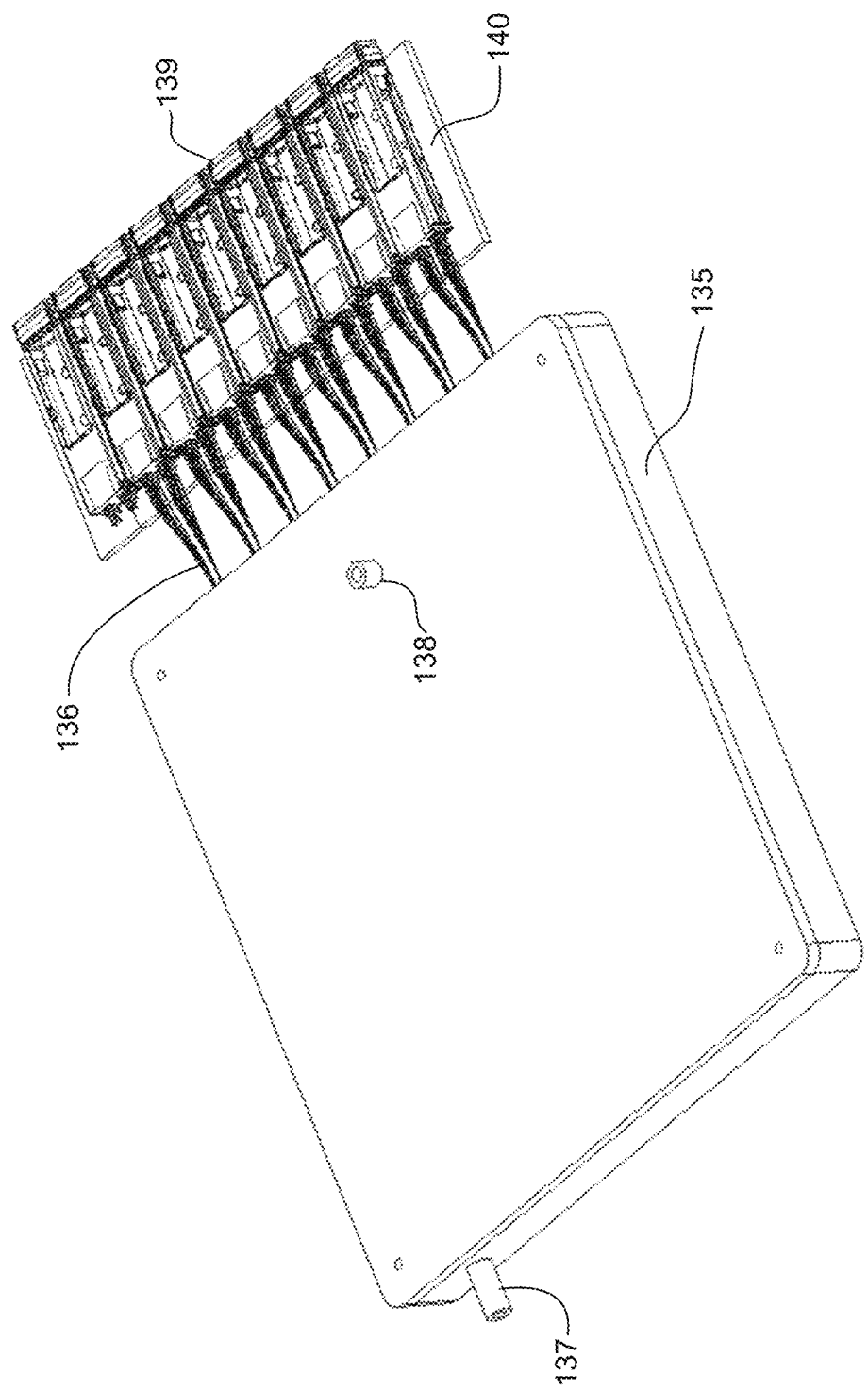
FIG. 13 is a top perspective of an immersion cooling enclosure for use on a daughter card.

FIG. 13 illustrates an example of an immersion cooling enclosure 135 for use on a daughter card, daughterboard, or any circuit board that plugs into and extends the circuitry of another circuit board. In one embodiment, an apparatus comprises the enclosure 135 configured for connection to a daughter card, a substrate within the enclosure, a plurality of components mounted on the substrate, a flow inlet connector 137, and a flow outlet connector 138. In this example, electrical wires are connected to pluggable optical modules 139 mounted on a separate printed circuit board (e.g., motherboard, mezzanine card) 140. The optical module operates as an engine that bidirectionally converts optical signals to electrical signals or in general as an interface to the network element copper wire or optical fiber.

Figure 14:
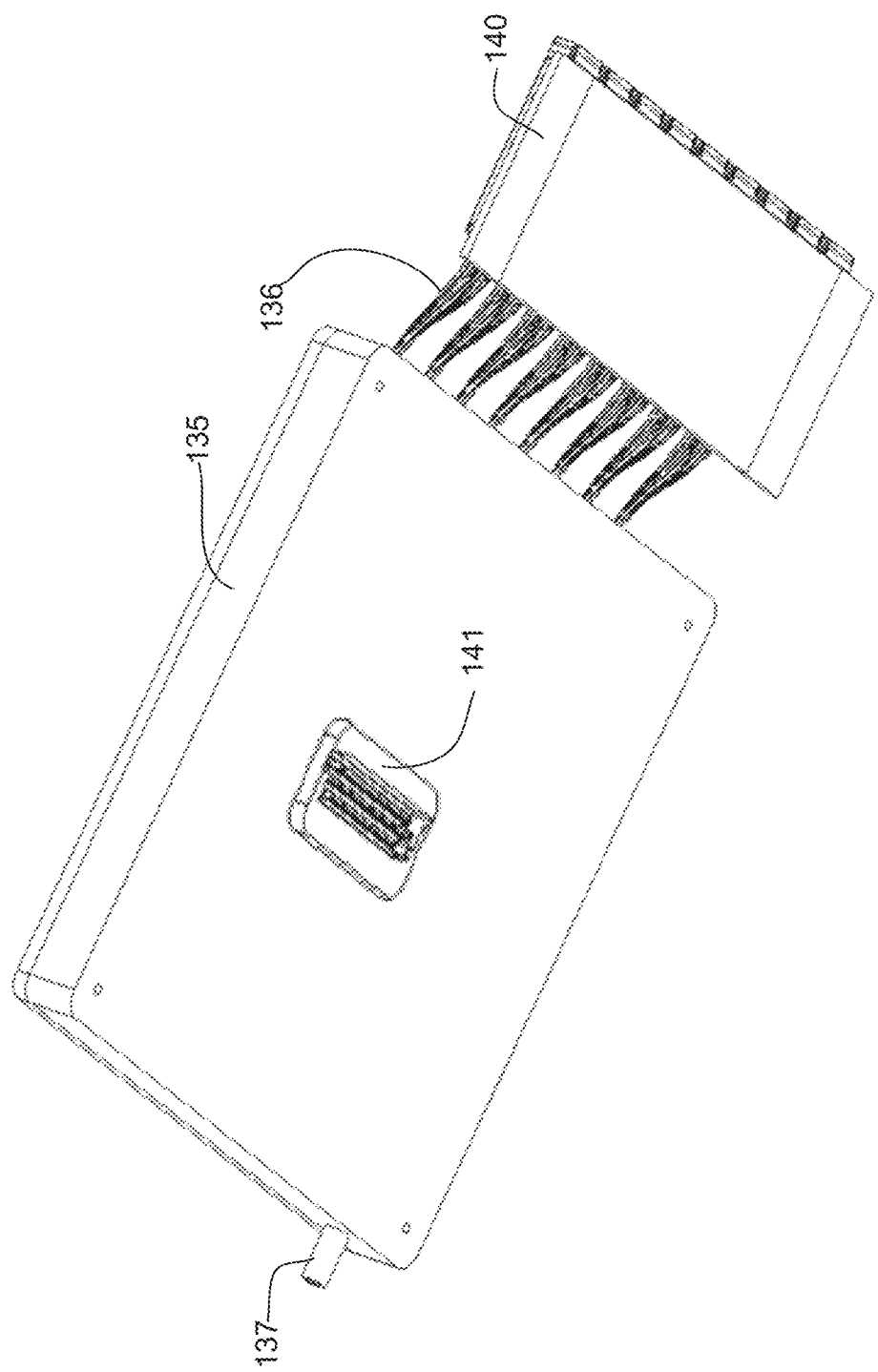
FIG. 14 is a bottom perspective of the immersion cooling enclosure shown in FIG. 13.

FIG. 14 is a bottom perspective of the immersion cooling enclosure 135 showing a connector 141 for providing a direct electrical connection to the daughter card (or other printed circuit board). Optical data may also be received at a sidewall connector, as previously described. The connector 141 is electrically coupled to a substrate (e.g., printed circuit board) 150 within the enclosure 135, as shown in FIG. 15.

Figure 15:
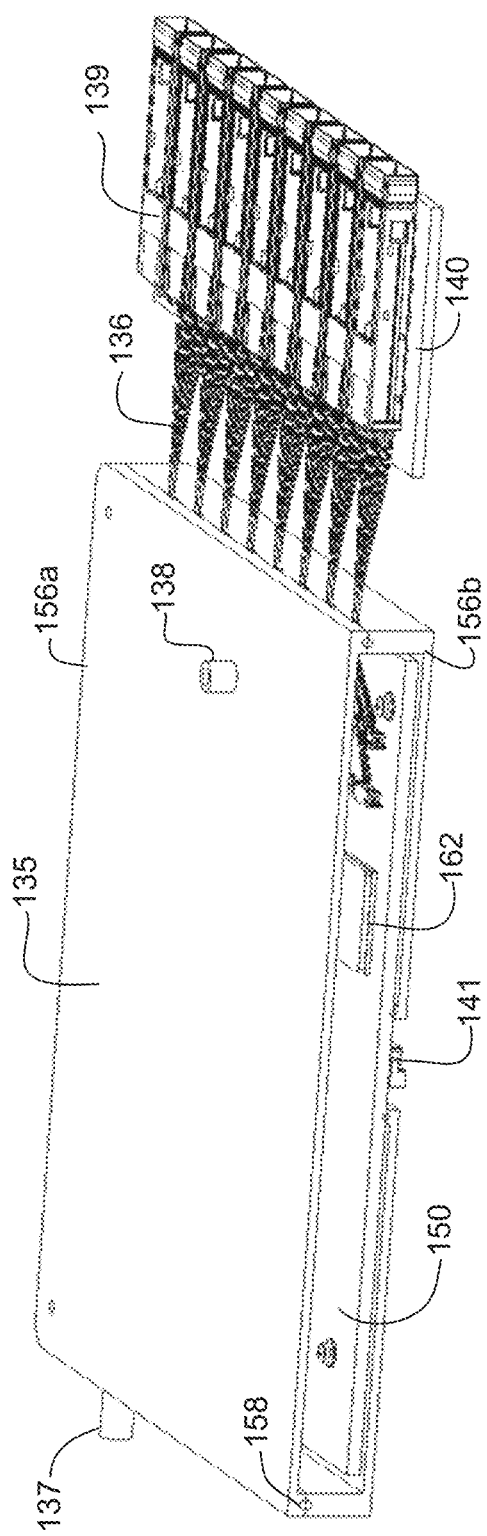
FIG. 15 is a perspective of the immersion cooling enclosure with a side wall removed.

FIG. 15 is a perspective with a sidewall of the immersion cooling enclosure 135 removed. The immersion cooling enclosure 135 may be defined by an upper housing 156a sealingly engaged with a lower housing 156b. A gasket 158 is positioned between the housings. Electrical cable or optical fiber 136 pass through a sidewall connection defined at the interface between the upper housing 156a and lower housing 156b. Any number of electronic or optical components may be mounted on the substrate 150. An internal component 162 is shown in FIG. 15.

Figure 16:
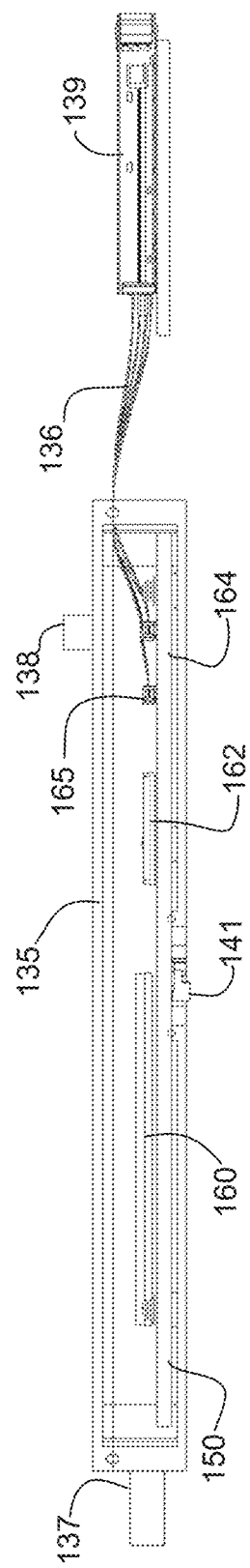
FIG. 16 is a side view of the immersion cooling enclosure shown in FIG. 15.

FIG. 16 is a side view of the immersion cooling enclosure 135 shown in FIG. 15. In this example, component 160, 162 (e.g., electrical or optical) are mounted on the PCB 150. Lines 136 are coupled to the PCB 150 at connection points 165. Electrical data may be routed through traces in the PCB 150 or on high-speed (e.g., twinaxial) electrical cables to electrical components.

Figure 17:
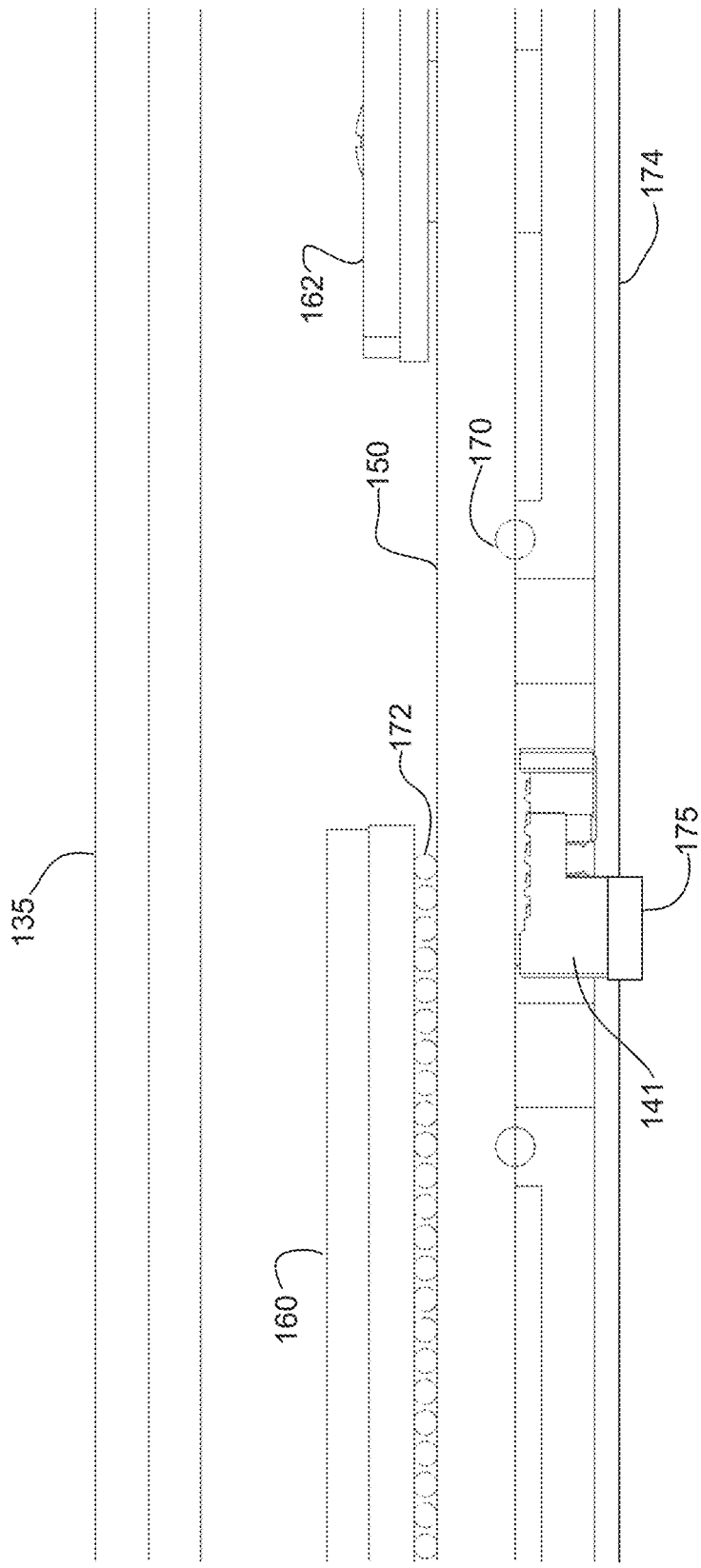
FIG. 17 is an enlarged view illustrating details of the enclosure shown in FIG. 16 connected to a daughter card.

FIG. 17 is an enlarged view of a portion of the immersion cooling enclosure 135 mounted on a PCB of a daughter card 174 and coupled through motherboard connector 141 and mating connector 175 on the daughter card. One or more gaskets 170 (or other sealing element or mechanism) may be provided to seal the lower housing against the PCB 150 at the connector 141 (or connector insert) interface. In this example, the component 160 (e.g., NPU, SerDes, or other component) is mounted on the PCB 150 using a BGA (Ball Grid Array) 172. The connector 141 may be a BGA type connector, press-fit type connector, or any other suitable type of connector.

Figure 18:
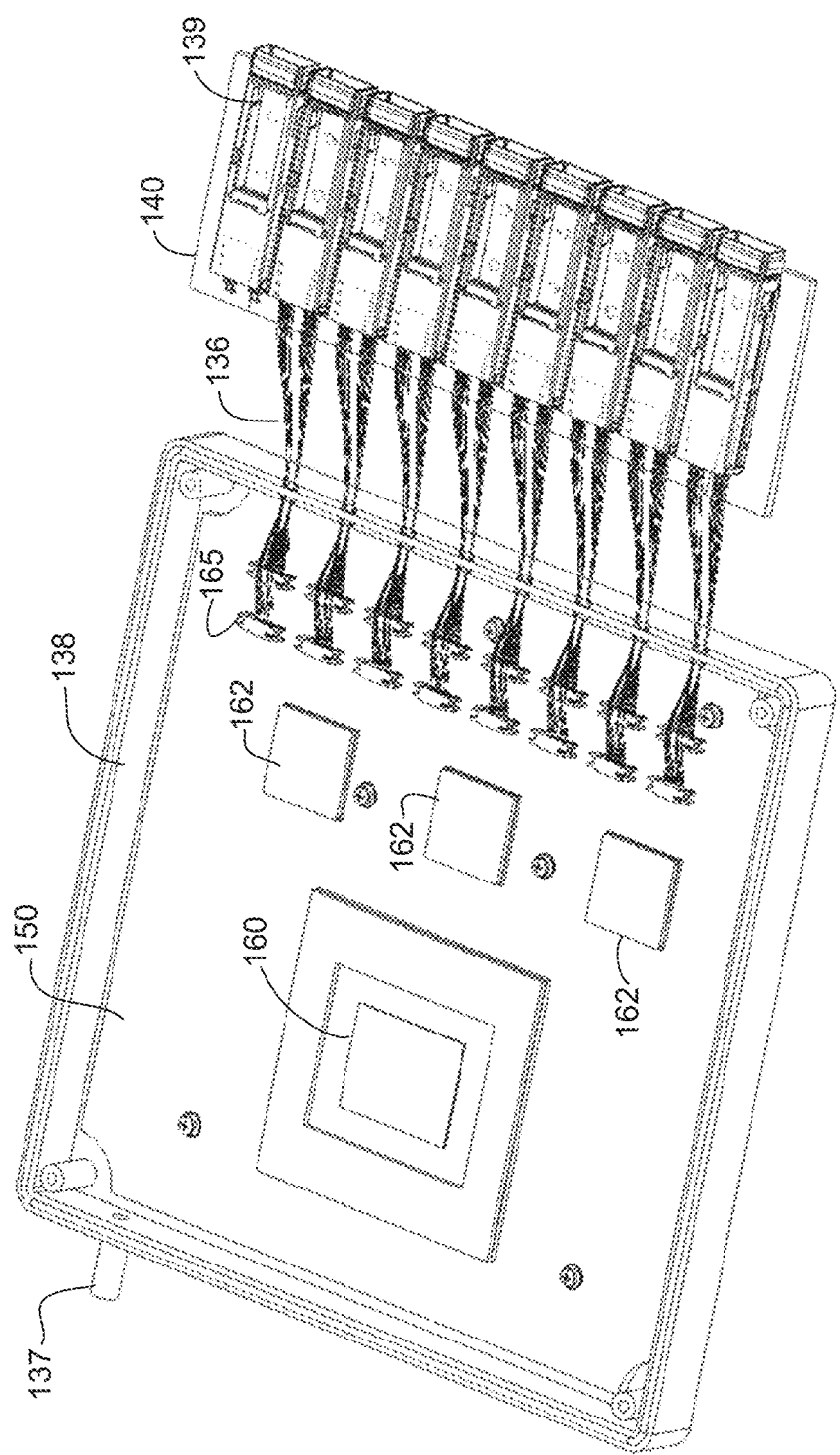
FIG. 18 is a perspective of the enclosure of FIG. 13 with a top removed to show internal components.

FIG. 18 is a top perspective of the immersion cooling enclosure 138 with a top removed to illustrate details within the enclosure. As previously described, one or more components 160, 162 are mounted on the PCB 150 and electrical cables or optical fibers 136 are coupled to the substrate at connection points 165. For simplification, optical connections and electrical connections between the wires or fibers 136 and components are not shown. For simplification, heat sink fins and other components are not shown.

Figure 19:
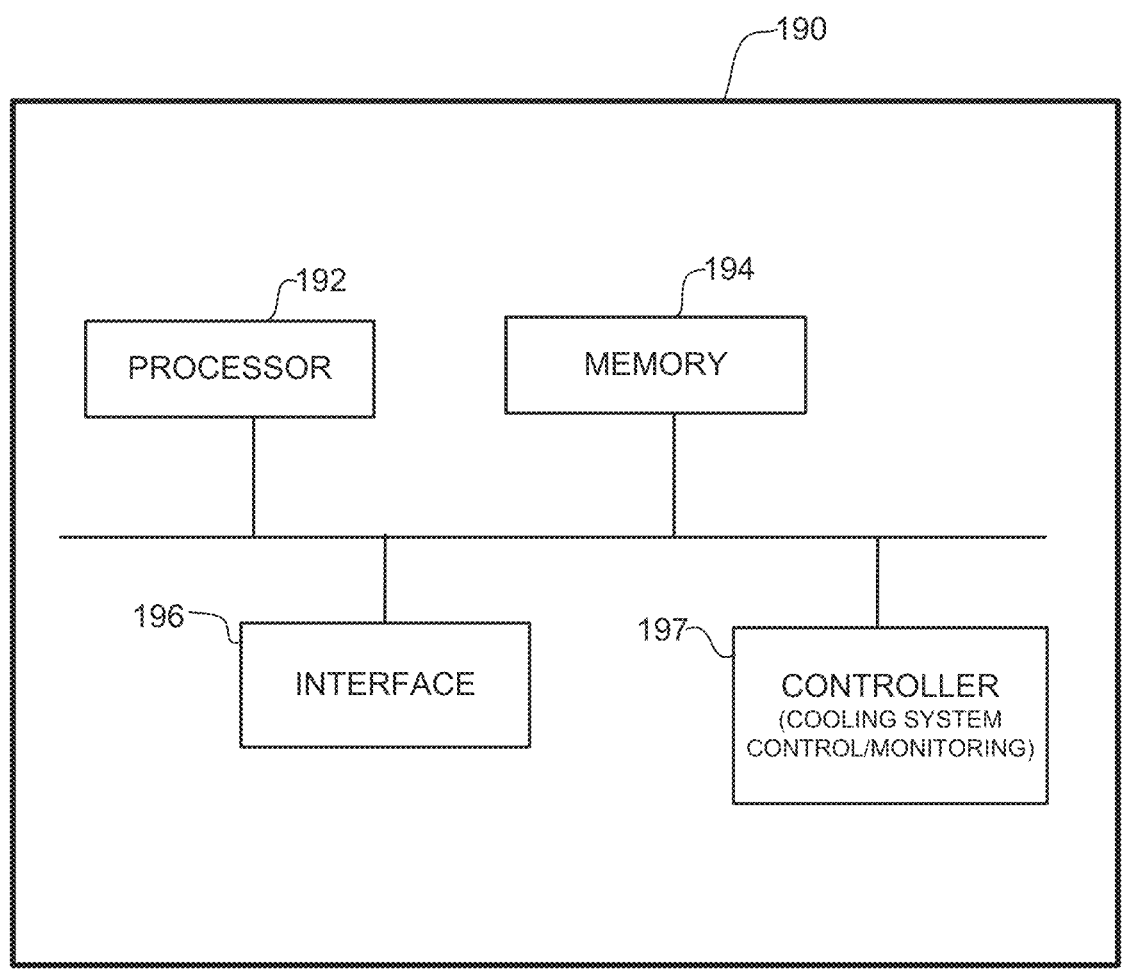
FIG. 19 is a block diagram of a network device in which embodiments described herein may be implemented.

As previously noted, the embodiments described herein may operate in the context of a network device. In one embodiment, a network device 190 is a programmable machine that may be implemented in hardware, software, or any combination thereof (FIG. 19). The network device 190 includes one or more processor 192, memory 194, and interfaces (power connections, data connections (electrical, optical)) 196, and controller 197 (cooling system control and monitoring). One or more of the components (e.g., processor, memory, interfaces (data, electrical, optical, cooling)) may be located on the line card.

Memory 194 may be a volatile memory or non-volatile storage, which stores various applications, operating systems, modules, and data for execution and use by the processor 192. The network device 190 may include any number of memory components.

Logic may be encoded in one or more tangible media for execution by the processor 192. For example, the processor 192 may execute codes stored in a computer-readable medium such as memory 194. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 190 may include any number of processors 192.

The controller 197 (e.g., logic, software, firmware, element, device) may be operable to monitor temperature, pressure, or flow at one or more locations within the network device and control cooling flow to one or more modules.

It is to be understood that the network device 190 shown in FIG. 19 and described above is only a simplified example and that the embodiments described herein may be implemented in different configurations of network devices. For example, the network device 190 may further include any suitable combination of hardware, software, algorithms, processors, devices, components, or elements.

As can be observed from the foregoing, one or more embodiments described herein provide numerous advantages over conventional systems. For example, one or more of the localized immersion cooling enclosure may be configured to fit on a single RU network card. The localized immersion cooling enclosure may cool large heat densities with a significantly reduced size heat sink and reduced pumping power, as compared to air-cooling. In one or more embodiments, the immersion cooling enclosure may absorb heat generated by external components via passive or conductive transport elements. In one or more embodiments, an external heatsink may provide fail-safe operation.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   an enclosure configured for connection to a printed circuit board;
   a substrate within the enclosure;
   a plurality of components mounted on the substrate, wherein the plurality of components comprise electronic components and optical components;
   a plurality of heat sinks thermally coupled to said plurality of components within the enclosure, wherein a fin density is different for the heat sinks thermally coupled to the optical components and the heat sinks thermally coupled to the electronic components;
   a fluid inlet connector and a fluid outlet connector; and
   a plurality of flow channels within the enclosure, at least one of the components disposed in each of said plurality of flow channels and segregated from other of said plurality of components in another of said flow channels;
   wherein the enclosure is configured for immersion cooling of said plurality of components.

2. The apparatus of claim 1 wherein said plurality of components comprise electronic and optical components.

3. The apparatus of claim 1 wherein said plurality of components comprise at least two different types of electronic components.

4. The apparatus of claim 1 wherein said fluid inlet connector comprises a separate fluid inlet for each of said plurality of flow channels.

5. The apparatus of claim 1 further comprising a heat pipe for transferring heat from a component to the enclosure, wherein the component is disposed external to the enclosure.

6. The apparatus of claim 5 wherein the component disposed external to the enclosure comprises a power component.

7. The apparatus of claim 6 wherein the power component comprises a plurality of POL (Point-of-Load) modules.

8. The apparatus of claim 1 further comprising a plurality of heat pipes thermally coupled to the enclosure.

9. The apparatus of claim 1 wherein the enclosure is configured for mounting on a line card comprising at least one other immersion cooling enclosure.

10. The apparatus of claim 1 further comprising a heat sink positioned on an outer surface of the enclosure.

11. The apparatus of claim 10 further comprising another heat sink disposed within the enclosure for use in said immersion cooling, wherein the heat sink positioned on said outer surface of the enclosure is for use with air-cooling.

12. The apparatus of claim 1 wherein flow is individually controlled to each of said plurality of flow channels based on a thermal load within each of said plurality of flow channels.

13. An apparatus comprising:
    a printed circuit board; and
    an enclosure coupled to the printed circuit board and comprising:
    a substrate within the enclosure;
    a plurality of components mounted on the substrate, wherein the plurality of components comprise electronic components and optical components;
    a heat sink thermally coupled to at least one of the electronic and optical components and contained within the enclosure, wherein a fin density is different for the heat sink if the heat sink is thermally coupled to an optical component or an electronic component;
    a fluid inlet connector; and
    a fluid outlet connector;
    wherein the enclosure is configured for immersion cooling of said plurality of components.

14. The apparatus of claim 13 wherein said plurality of components comprise electronic and optical components.

15. The apparatus of claim 13 further comprising another heat sink mounted on an outer surface of the enclosure.

16. The apparatus of claim 13 further comprising a heat pipe for transferring heat from a component to the enclosure, wherein the component is disposed external to the enclosure.

17. The apparatus of claim 16 wherein the enclosure is connected to a first surface of the printed circuit board and the component is positioned adjacent to an opposite surface of the printed circuit board.

18. The apparatus of claim 16 wherein the heat pipe is thermally coupled to the enclosure.

19. The apparatus of claim 13 further comprising a plurality of heat pipes coupled to the enclosure.

20. The apparatus of claim 13 further comprising a second enclosure coupled to the printed circuit board for immersion cooling another group of components.

21. The apparatus of claim 13 wherein the printed circuit board is located on a line card configured for insertion into a single rack unit slot of a chassis.

22. The apparatus of claim 13 wherein the heat sink comprises channels shaped to increase a surface area exposed to liquid in the enclosure.

23. A printed circuit board comprising:
    an immersion cooling enclosure connected to the printed circuit board and comprising a plurality of internal components within the immersion cooling enclosure;
    a heat generating component located external to the immersion cooling enclosure; and
    a heat transfer element for transferring heat from the heat generating component to the immersion cooling enclosure for dissipation within the immersion cooling enclosure, the heat transfer element extending through openings in the printed circuit board and connected to a heat spreader;
    wherein a dielectric liquid passes through the immersion cooling enclosure for dissipation of heat from the plurality of internal components and the heat generating component.

24. The printed circuit board of claim 23 wherein the heat transfer element comprises a heat pipe.

25. The printed circuit board of claim 23 further comprising a heat sink disposed within the immersion cooling enclosure, wherein the heat transfer element is coupled to the immersion cooling enclosure.

26. The printed circuit board of claim 23 wherein the immersion cooling enclosure is positioned on one side of the printed circuit board and the heat generating component is positioned on an opposite side of the printed circuit board.

27. The printed circuit board of claim 23 wherein the heat generating component comprises a plurality of POL (Point-of-Load) modules.

28. The printed circuit board of claim 23, further comprising:
    an air-cooling heat sink located external to the immersion cooling enclosure.

29. The printed circuit board of claim 28, wherein the air-cooling heat sink is configured to sustain limited capacity operation in a fail-safe mode.

30. An apparatus comprising:
an enclosure configured for connection to a daughter card, the enclosure including an upper housing engaged with a lower housing;
a substrate within the enclosure;
a connector electrically coupled to the substrate for providing an electrical connection to the daughter card;
a sealing element for sealing the lower housing against the substrate at the connector;
a plurality of components mounted on the substrate;
a fluid inlet connector; and
a fluid outlet connector;
wherein the enclosure is configured for immersion cooling of said plurality of components.

31. The apparatus of claim 30 wherein data is received on lines entering the enclosure at an interface between said upper housing and said lower housing from components mounted on a printed circuit board separate from the daughter card.

32. The apparatus of claim 30, wherein the connector is an electrical connector on a lower surface of the enclosure for connection with the daughter card.

33. The apparatus of claim 30 wherein the enclosure is configured for single-phase liquid cooling with liquid flowing through the fluid inlet connector and the fluid outlet connector.

34. The apparatus of claim 30, wherein the enclosure includes a gasket positioned between the upper housing and the lower housing.

35. The apparatus of claim 30, wherein the connector is a Ball Grid Array type connector or a press-fit type connector.

* * * * *